(12) United States Patent
Ashtekar et al.

(10) Patent No.: US 12,108,595 B2
(45) Date of Patent: Oct. 1, 2024

(54) INTEGRATED FUSE IN SELF-ALIGNED GATE ENDCAP FOR FinFET ARCHITECTURES AND METHODS OF FABRICATION

(71) Applicant: Intel Corporation, Santa Clara, CA (US)

(72) Inventors: Sumit Ashtekar, Portland, OR (US); Rahul Ramaswamy, Portland, OR (US); Walid Hafez, Portland, OR (US); Hector M. Saavedra Garcia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 17/001,525

(22) Filed: Aug. 24, 2020

(65) Prior Publication Data

US 2022/0059552 A1    Feb. 24, 2022

(51) Int. Cl.
| | |
|---|---|
| *H01L 21/8238* | (2006.01) |
| *H01H 85/02* | (2006.01) |
| *H01L 29/66* | (2006.01) |
| *H01L 29/78* | (2006.01) |
| *H10B 20/20* | (2023.01) |

(52) U.S. Cl.
CPC ......... *H10B 20/20* (2023.02); *H01H 85/0241* (2013.01); *H01L 29/66545* (2013.01); *H01L 29/66795* (2013.01); *H01L 29/7851* (2013.01); *H01H 2085/0283* (2013.01)

(58) Field of Classification Search
None
See application file for complete search history.

(56) References Cited

U.S. PATENT DOCUMENTS

| | | | |
|---|---|---|---|
| 2013/0187206 A1 | 7/2013 | Mor et al. | |
| 2016/0315175 A1 | 10/2016 | He et al. | |
| 2020/0043914 A1 | 2/2020 | Olac-Vaw et al. | |
| 2020/0266194 A1 | 8/2020 | Bambery et al. | |

FOREIGN PATENT DOCUMENTS

| | | | |
|---|---|---|---|
| EP | 3550602 | 10/2019 | |
| WO | WO-2018118087 A1 * | 6/2018 | ..... H01L 21/823821 |

OTHER PUBLICATIONS

Extended European Search Report from European Patent Application No. 21190692.0 notified Jan. 20, 2022, 8 pgs.
Office Action from European Patent Application No. 21190692.0 notified Jun. 5, 2024, 4 pgs.

* cited by examiner

*Primary Examiner* — Joseph C. Nicely
*Assistant Examiner* — Lamont B Koo
(74) *Attorney, Agent, or Firm* — Essential Patents Group, LLP

(57) ABSTRACT

A device structure includes a first gate on a first fin, a second gate on a second fin, where the second gate is spaced apart from the first gate by a distance. A fuse spans the distance and is in contact with the first gate and the second gate. A first dielectric is between the first fin and the second fin, where the first dielectric is in contact with, and below, the fuse and a second dielectric is between the first gate and the second gate, where the second dielectric is on the fuse.

18 Claims, 16 Drawing Sheets

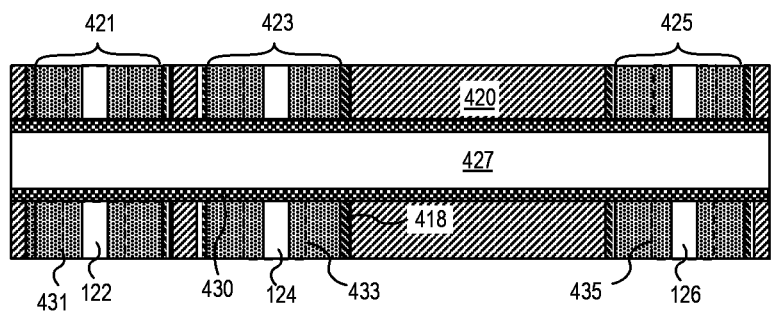
FIG. 6A
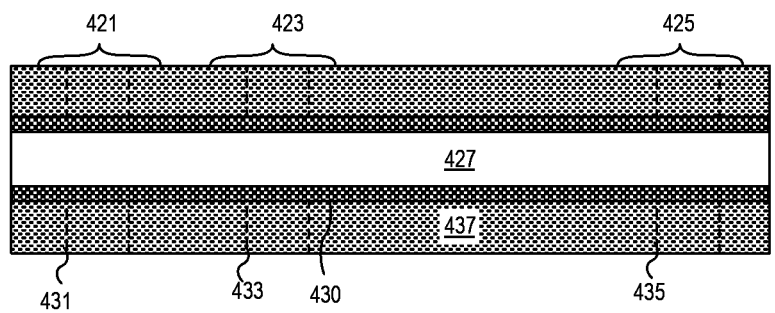
FIG. 6B
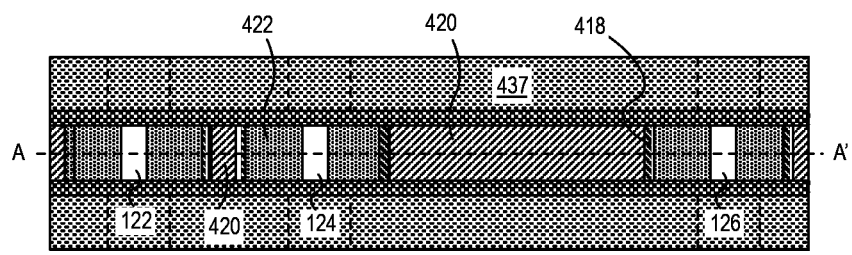
FIG. 6C

INTEGRATED FUSE IN SELF-ALIGNED GATE ENDCAP FOR FinFET ARCHITECTURES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of devices on a chip, lending to the fabrication of products with increased functionality. For SOC applications, two or more transistors may be connected by one time programmable fuse. While fuses have been utilized in interconnect structures, integration of fuse within the transistor gate level can offer numerous device as well as processing advantages.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 6A illustrates the structure of FIG. 5B following the formation of dummy gate structures in a plurality of openings.

FIG. 6B illustrates the structure of FIG. 6A following the formation of a fifth dielectric in the plurality of openings.

FIG. 6C illustrates the structure of FIG. 6B following the removal of the dummy gate structure.

DESCRIPTION OF THE EMBODIMENTS

Figure 1A:
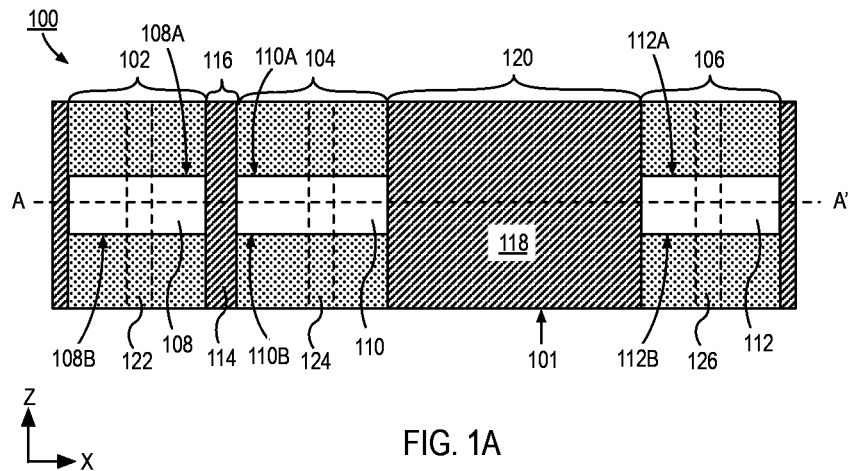
FIG. 1A is a plan view illustration of device structure, where the device structure includes a plurality of transistors, in accordance with an embodiment of the present disclosure.

Integrated fuse in self-aligned gate endcap for FinFET architectures and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with FinFET transistors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

One-time programmable (OTP) fuse elements are used in conjunction with large arrays of logic transistors for a variety of SOC applications. SoC applications utilize functional blocks that are all CMOS compatible. Due to manufacturing and testing process some components need to be repaired, tuned or calibrated, whereas other components may need to be personalized or programmed Fuse elements can be effectively used to isolate device components such as transistors in logic circuitry. Fuse elements can also be used for static discharge protection in an integrated circuit.

In CMOS circuitry, fuse elements are made of thick metal layers and are typically positioned above active transistors at an interconnect level in the back end, either between M1 and M2 or M2 and M3. However, such fuse elements can require integrated charge pumps that are utilized to program logic transistors below the interconnect level transistor. Such change pumps require additional area on a chip. Typical plan view area of fuse elements on an IC chip is between 1 and 2 microns, where the fuse elements require a programming voltage that can be substantially high, for example up to 4V. High programming voltage necessitates high current requirements in order to breakdown the thick metal structures. This problem may be mitigated by insertion of a fuse at the transistor level instead at an interconnect level.

The inventors have found that an OTP fuse element can be successfully integrated with CMOS transistors. More specifically the OTP fuse element can be integrated at a gate level in FinFET architectures. A gate endcap structure may be implemented in CMOS FinFET architectures to isolate two or more transistors from each other. For example, a metal gate of a first transistor and may be isolated from a metal gate of a second transistor by the gate endcap structure located between the two devices.

A fuse element can be more specifically integrated in the gate endcap structures between two directly adjacent transistors. Such fuse elements occupy a region between two adjacent gate structures that covers an area that is approximately 30 nm×50 nm. A gate endcap integrated fuse structure is advantageous because it may utilize low programing voltage (less than or equal to 1V), because the fuse is a relatively thin element having a thickness that is few nanometers or less. A low voltage requirement also obviates the need for charge pumps and additional circuitry. The fuse element may have a thickness that permits breakdown at low currents and may not need additional charge pumping circuitry. In some embodiments the fuse element may be as thin as 1 nm.

The inventors have found that a fuse element can be integrated within a gate endcap between two transistors for operational advantage as well as for ease of fabrication. The fuse element, for example can be fabricated simultaneously during fabrication of transistor gates. Gate endcap structures offer additional advantage in that the structure is self-aligned with the gate. In an embodiment, the gate endcap structure includes a top portion that is formed with an etch resistance material such as oxide of a metal such as hafnium, zirconium, lanthanum etc while the bottom portion includes a material such as silicon nitride, silicon carbide or silicon oxynitride. It is beneficial for the top portion of the gate endcap structure to include an etch resistant material to minimize damage caused by multiple etch processes during a transistor fabrication sequence. While an etch resistant material such as hafnium oxide, for example, may be ideal for entire gate endcap structure for fabrication advantages, hafnium oxide can also increase overlap capacitance between transistor gates. Hence, the top portion of the gate endcap structure has a thickness that balances etch selectivity with a threshold overlap capacitance requirement to preserve transistor performance.

Gate endcap integrated fuse structures offer further advantage that they may be integrated in gate endcaps between select transistors and omitted between others. In one embodiment, gate endcaps where fuse elements are not desired are masked during the fabrication process so that no metal is deposited to form a fuse. In other embodiments, the fuse may be present between two transistors that are spaced apart by a first distance (such as 15 nm-25 nm for example) but absent between two transistors that are spaced apart by a distance that is as little as two times greater than the first distance. The separation between the two transistors defines a width of the gate endcap.

In accordance with embodiments of the present disclosure, device structure includes a first gate of a first transistor on a first fin, a second gate of a second transistor on a second fin, where the first gate is spaced apart from the first fin by a first distance. The device structure includes a fuse spanning the distance and in contact with the first gate and the second gate. A first dielectric is between the first fin and the second fin, wherein the first dielectric is in contact with, and below, the fuse. A second dielectric is between the first gate and the second gate, wherein the second dielectric is on the fuse.

In some embodiments, a third gate of a third transistor is separated from the first or the second transistor by a second distance. In some such embodiments, a third dielectric is between the first fin or the second fin and a fourth dielectric is directly on the third dielectric and a fuse is not present between third and the fourth dielectric. In some embodiments, the second distance is the same as the first distance. In other embodiments, the second distance is at least two times greater than the first distance. Where the second distance is greater than the second distance, there may be two or more distinct dielectric materials present between the third and the fourth dielectric.

FIG. 1A is a plan view illustration of device structure 100 over a substrate 101 (not directly visible) where the device structure 100 includes a plurality of transistors 102, 104 and 106. Each transistor 102, 104, and 106 includes a gate 108, 110, and 112 respectively as shown. Each gate is separated from an adjacent gate by a gate endcap structure. The gate endcap structure may include one or more layers of dielectric. Ordinarily the gate endcap structure provides an electrical isolation between any two transistors, however, in the present disclosure, a fuse element is embedded within select gate endcap structures as will be discussed further below. As shown in the plan-view illustration, the transistors 102 and 104 are separated by a dielectric 114 of a gate endcap structure 116. In the illustrative embodiment, the dielectric 114 extends laterally beyond (Z-axis) gate sidewalls 108A and 108B and gate sidewalls 110A and 110B. In the illustrative embodiment, the gates 104 and 106 are separated by a dielectric 118 of a gate endcap structure 120, where the gate endcap structure 120 extends laterally beyond (Z-axis) gate sidewalls 110A and 110B and gate sidewalls 112A and 112B.

Each transistor 102, 104, or 106 may include one or more fins. In the illustrative embodiment, the individual transistors 102, 104 and 106 include a single fin. For example, transistor 102 includes a fin 122, transistor 104 includes a fin 124 and transistor 106 includes a fin 126.

Figure 1B:
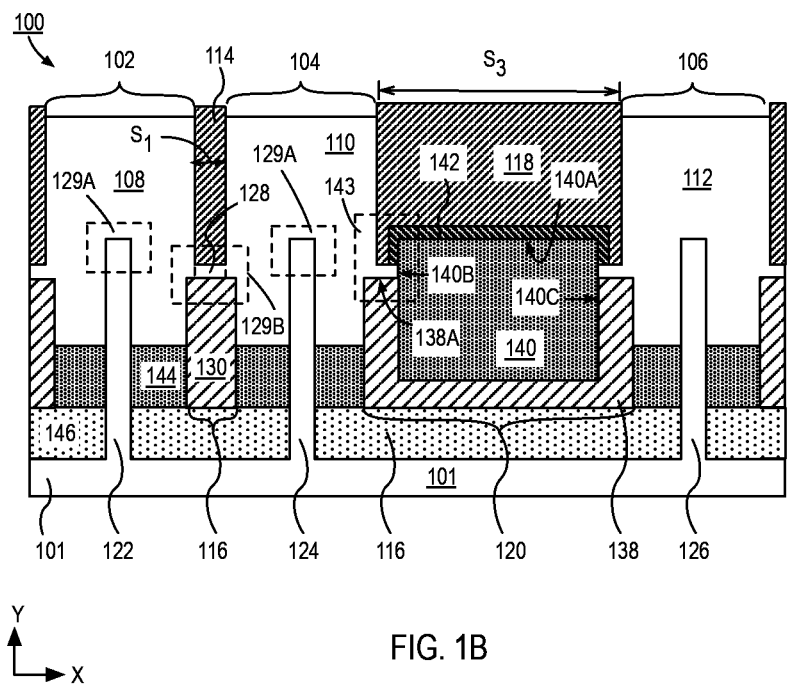
FIG. 1B is a cross sectional illustration of the device structure through a line A-A'.

FIG. 1B is a cross sectional illustration of the device structure 100 through the line A-A'. The device structure includes a gate 108 on the fin 122 and a gate 110 on the fin 122, where the gate 108 is spaced apart from the gate 110 by a distance $S_1$. The device structure 100 further includes a fuse 128 spanning the distance $S_1$. The fuse 128 is in contact with the gate 108 and the gate 110. The gate endcap structure 116 further includes a dielectric 130 between the fin 122 and the fin 124, where the dielectric 130 is in contact with, and below, the fuse 128. As shown, the dielectric 114 is between the gate 108 and the gate 110, where the dielectric 114 is on the fuse 128.

Figure 1C:
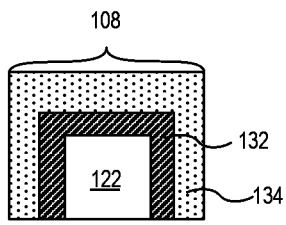
FIG. 1C is an enhanced cross-sectional illustration of a portion of a gate on a first fin.

In an exemplary embodiment, the gate includes a gate dielectric and a gate metal having a work function of the gate. FIG. 1C is an enhanced cross-sectional illustration of portion 129A of the gate 108 on the fin 122. As shown, gate 108 includes a gate dielectric layer 132 and a gate metal 134 on the gate dielectric layer 132. In embodiments, the gate dielectric layer 132 includes a material having a high dielectric constant or high-K material. Examples of gate dielectric layer 132 include oxygen and one or more of elements such as hafnium, silicon, titanium, tantalum, lanthanum, aluminum, zirconium, barium, strontium, yttrium, lead, scandium, niobium, or zinc. Examples of high-K material that may be used in the gate dielectric layer 132 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate metal 134 may include at least one P-type work function metal or an N-type work function metal, depending on whether a transistor is to be a PMOS or an NMOS transistor. Examples of N type material include hafnium, zirconium, titanium, tantalum, aluminum, alloys of these metals, and carbides of these metals such as hafnium carbide, zirconium carbide, titanium carbide, tantalum carbide, or aluminum carbide and examples of P type materials include ruthenium, palladium, platinum, cobalt, nickel, or conductive metal oxides, e.g. ruthenium oxide.

Figure 1D:
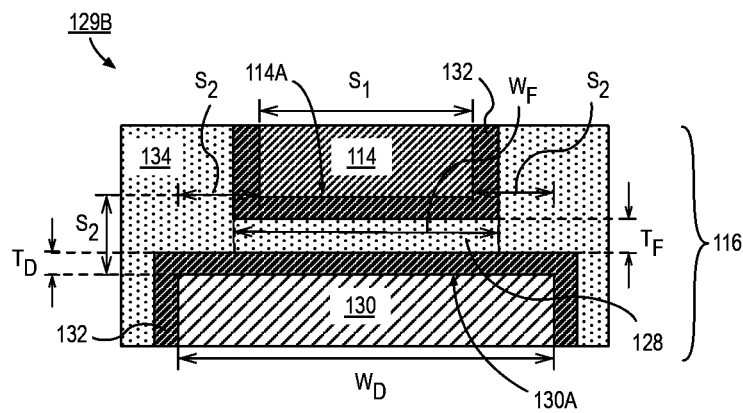
FIG. 1D is an enhanced cross-sectional illustration of a fuse.

An enhanced cross-sectional illustration of a portion 129B of the fuse 128 and gate endcap structure 116 is illustrated in FIG. 1D. As shown in 129B the fuse 128 occupies a space between the dielectric 114 and dielectric 130 within the gate endcap structure 116. The dielectric 114 and dielectric 130 have a vertical separation $S_2$. A portion of the space between the dielectric 114 and dielectric 130 within the gate endcap structure 116 also includes the gate dielectric layer 132. As shown the fuse 128 is between the gate dielectric layer 132 adjacent to the dielectric 114 and the gate dielectric adjacent to the dielectric 130. The fuse 128 has a vertical thickness, $T_F$, that is less than the distance $S_2$ due to presence of the gate dielectric layer 132 adjacent to the dielectric 114 and due to presence of the gate dielectric adjacent to the dielectric 130. In an embodiment, the gate dielectric layer 132 has a thickness that is less than or equal to half the thickness of the vertical separation $S_2$. As shown, the gate dielectric layer 132 has a thickness that is less than half the thickness of the vertical separation $S_2$.

In the illustrative embodiment, the dielectric 130 has an uppermost surface 130A and dielectric 114 has a lowermost surface 114A that are substantially planar. In some such embodiments, $S_2$ is substantially uniform. In the illustrative embodiment, the fuse 128 has a lateral thickness, $W_F$, where $W_F$, is dependent on the spacing, $S_1$ and a thickness of the gate dielectric layer 132. In embodiments, the spacing, $S_1$ is between 15 nm and 25 nm. As shown, $W_F$ is greater than $S_1$ by two times a thickness, $T_D$, of the gate dielectric layer 132. $W_F$ and $T_F$ may be advantageously chosen to obtain a fuse size that enables a maximum current to be transmitted before disintegration. In an embodiment, the fuse 128 has a thickness, $T_F$ that is at least 2 nm.

The fuse 128 includes a material of the gate metal 134. In embodiments, where the gate metal 134 includes a plurality of layers, the fuse 128 can include one or more layers of the plurality of layers, depending on the thickness of individual layers. For example, the fuse may include one or more layers of metal having a total thickness that is limited to a thickness $T_F$. In other embodiments, if a lower most layer in a plurality of layers has a thickness greater than $T_F$, the fuse includes a material of the lower most layer that is directly adjacent to gate dielectric layer 132. In some embodiments, where the gate metal 134 includes a workfunction layer and a fill metal, the fuse 128 can include the work function layer and not the fill metal.

In embodiments, the dielectric 130 and dielectric 114 each have a lateral width (along the X-direction) that are unequal to each other. For example, as shown the lateral width of the dielectric 114 is less than a lateral width of the dielectric 130. In the illustrative embodiment, where sidewalls of the dielectric 130 and 114 are substantially vertical with respect to the surfaces 130A and 114A, the dielectric 130 has a lateral thickness, $W_D$, that is greater than the lateral thickness, $S_1$, of the dielectric 114. In some such embodiments, $W_D$ is greater than $S_1$, by as much as two times the separation $S_2$. In other embodiments, the dielectric 114 can have a lateral width $S_1$ that varies with height from lowermost surface 114A. In some embodiments, $S_1$ can have a maximum value that is substantially equal to or greater than $W_D$.

Figure 1E:
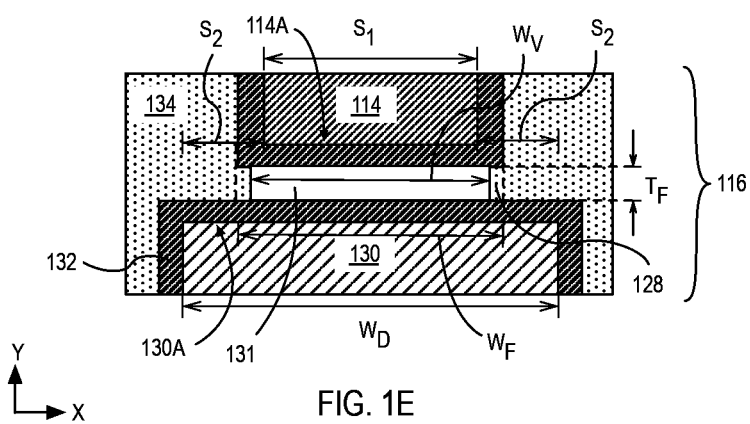
FIG. 1E is an enhanced cross-sectional illustration of a fuse having a void.

In other embodiments, a portion of the fuse 128 is discontinuous, as shown in FIG. 1E. In some such embodiments, the portion of the fuse 128 that is discontinuous includes a void 131. As shown, portions of the fuse 128 extend between the gate dielectric layer 132 adjacent to surfaces 130A and 114A and a void 131 occupies the remaining portion of a space between the gate dielectric layer 132 adjacent to surfaces 130A and 114A. There is no gate metal 134 in the void 131. In the illustrative embodiment, the gate dielectric layer 132 is adjacent to the dielectric surfaces 130A and 114A. As shown, the void 131 has a width $W_V$. In embodiments, $W_V$, is less than $W_F$. In other embodiments, $W_V$, is substantially equally to $W_F$.

In other examples, where there is a void 131, the gate dielectric layer 132 may also be discontinuous on dielectric surfaces 130A and 114A. The void 131 may be a result of a potential difference applied between gate 108 and gate 110, such as a potential difference above 1V. The potential difference may be induced during operation by an axis transistor. The axis transistor may have one terminal, at a positive or negative potential, that is connected to one of gate 108 or gate 110. The other of the gate 108 or gate 110 not connected to the axis transistor may be at ground potential.

Figure 1F:
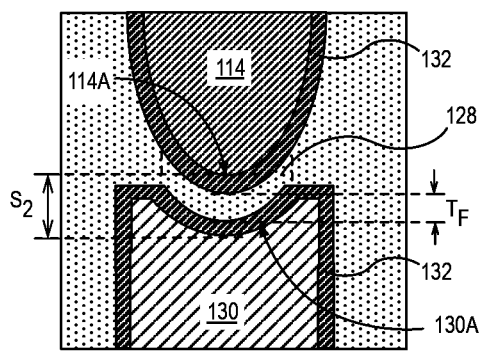
FIG. 1F is an enhanced cross-sectional illustration of a fuse that has an irregular shape.

In other examples, the fuse 128 has an irregular shape, where the fuse is substantially matched with shapes of the dielectric 114 and dielectric 130. For example, as shown in FIG. 1F, the dielectric 130 has uppermost surface 130A that is non-planar. The non-planar surface 130A may be curved in sections as shown. In some such embodiments, the dielectric 114 has a curved shape, where portions of the curved shape are substantially matched to curved sections of the dielectric surface 130A. In embodiments where the surfaces 114A and 130A are not planar the separation, $S_2$, may not be uniform. As shown, the spacing between the dielectric 130 and the dielectric 114 has a minimum separation, $S_2$. In embodiments the fuse has a thickness $T_F$ that is at least 2 nm. As shown, the fuse 128 is continuous between the gate 108 and gate 110.

Referring again to FIG. 1B, in an embodiment, dielectric 130 includes silicon and one or more of oxygen, nitrogen and carbon. In embodiments, the dielectric 114 includes oxygen and one or more of hafnium, titanium, tantalum, lanthanum, aluminum, zirconium, barium, strontium, yttrium, lead, scandium, niobium, zirconium or zinc. The dielectric 114 is suitably chosen to enable fabrication of the gate endcap structure 116 and to provide an adequate vertical thickness to isolate gate 110 from gate 108.

As shown transistor 106 is electrically isolated from the transistor 104 by a gate endcap structure 120. As shown the gate 110 and gate 112 are spaced apart by a distance $S_3$. In an embodiment, $S_3$ is at least 50 nm. In the illustrative embodiment, the gate endcap structure 120 includes a dielectric 138 between fin 124 and fin 126, a dielectric 140 within the dielectric 138, the dielectric 118 above the dielectric 140 and a liner layer 142 in contact with and between the dielectric 118 and dielectric 140. The dielectric 140 has an uppermost surface 140A and the dielectric 138 has a uppermost surface 138A, where the surfaces 140A and 138A may be co-planar or at different levels. In the illustrative embodiment, the surface 140A extends above the surface 138A for structural advantages as will be described below. The dielectric 138 may have a lateral thickness (along the X direction) that is greater than a lateral thickness of the dielectric 118 and is indicative of a process operation utilized to fabricate the gate endcap structure 120.

Figure 1G:
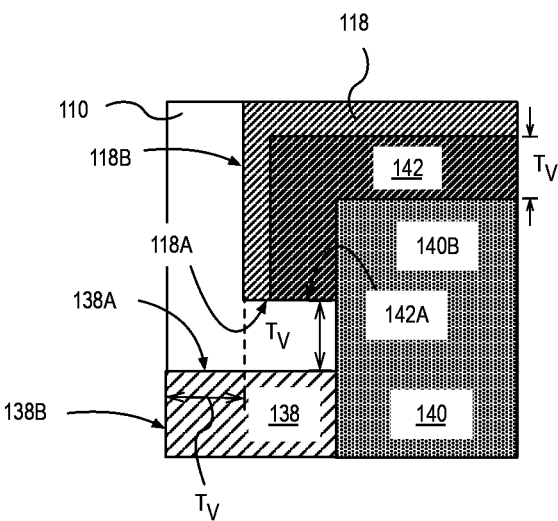
FIG. 1G is an enhanced cross-sectional illustration of a portion of the gate endcap structure depicted in FIG. 1B.

FIG. 1G is an enhanced cross-sectional illustration of a portion of the gate endcap structure 120 inside box 143. The liner layer 142 may extend over a portion of the dielectric surface 140A or over the entire surface 140A as shown. The liner layer 142 has a thickness $T_L$. When the surface 140A extends above the surface 138A the liner layer 142 may also be adjacent to dielectric sidewall 140B, such as is shown. In examples where liner layer 142 is adjacent to dielectric sidewall 140B, dielectric 118 may be adjacent to the portion of the liner layer 142 that is directly adjacent to sidewall 140B, as shown.

The liner layer 142 has a lowermost surface 142A that may be at a level substantially equal to or a level that is above or below the dielectric surface 118A. In the illustrative embodiment, dielectric surface 118A is substantially aligned with lower most dielectric surface 118A. In embodiments, the dielectric surface 118A is above the dielectric surface 138A by a distance that is substantially equal to a thickness of the liner layer 142, such as is shown. In some such embodiments portion of the gate 110 (is in the space between dielectric surface 138A and dielectric surface 118A.

In the illustrative embodiment, the dielectric sidewall 138B extends beyond the sidewall 118B. In some embodiments where the dielectric 118 is adjacent to the portion of the liner layer 142 that is directly adjacent to sidewall 140B, the dielectric sidewall 138B extends beyond the sidewall 118A by a distance that is substantially equal to a thickness of the liner layer 142, such as is shown.

Referring again to FIG. 1B, the liner layer 142 may be substantially symmetric about the dielectric 140 as shown. In some embodiments, liner layer 142 may be asymmetric about the dielectric 140, relative the dielectric surface 138A. For example, portions of the liner layer 142 may not be present on sidewall 140C but present on sidewall 140B. In other examples, the liner layer 142 may be on sidewalls 140B and 140C, but at different heights relative to dielectric surface 138A.

As shown, the device structure 100 also includes a dielectric 144 adjacent to the fin 122 fin 124 and the fin 126. Heights of uppermost surfaces of the fins 122 and 124 relative the dielectric surface 144A may be determined by choosing an appropriate vertical thickness of the dielectric 144. As shown, the device structure further includes a dielectric 146 below dielectric 144 and adjacent to the fins 122, 124 and 126. The dielectric 146 is also directly below dielectrics 130 and 138.

In embodiments, the dielectric 140 includes a material that is the same or substantially the same as the material of dielectric 130, and dielectric 118 includes a material that is the same or substantially the same as the material of the dielectric 114. In an embodiment, the dielectric 144 includes a material that is the same or substantially the same as the material of the dielectric 140. In an embodiment, the dielectric 140 includes silicon and one or more of nitrogen, oxygen or carbon. In embodiments, the dielectric 146 includes silicon and one or more of nitrogen, oxygen or carbon. The dielectric 146 may be compositionally different from the dielectric 144, for example, dielectric 144 has a greater density than a density of the dielectric 146. In various embodiments, the liner layer 142 includes silicon and oxygen.

In an embodiment, substrate 101 includes a material such as single crystal silicon, polycrystalline silicon and silicon on insulator (SOI), as well as substrates formed of other semiconductor materials such as group III-V materials. In some embodiments, the substrate 101 may also include semiconductor dopants depending on a desired MOS characteristic. In an embodiment, the fins 122, 124 and 126 include a same material as the material of the substrate 101 such as single crystal silicon or one or more layers of group III-V materials.

In exemplary embodiments, gates 110 and 112 each include a same material as material of gate 108.

In some examples, a first pair of transistors may be separated by a first gate endcap including a fuse and a second adjacent pair of transistors may be separated by a second gate endcap that does not include a fuse, where the first and second gate endcap s are substantially equal in lateral width.

Figure 2A:
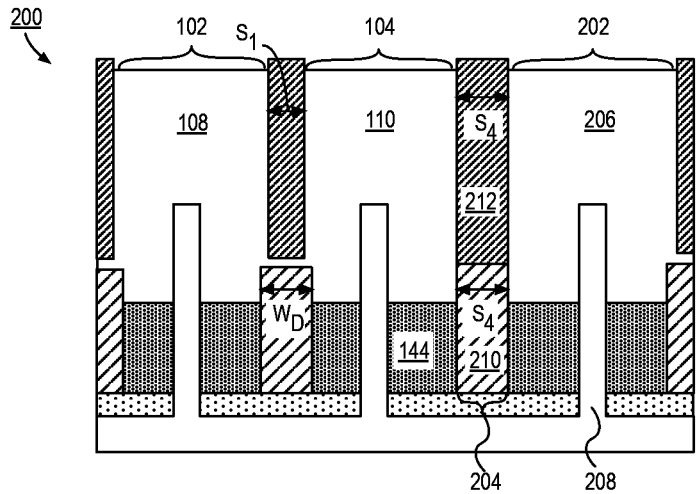
FIG. 2A is a cross-sectional illustration of a device structure where a first and second transistors are separated by a gate endcap structure.

FIG. 2A is a cross-sectional illustration of a device structure 200 where the transistors 104 and 202 are separated by a gate endcap structure 204. As shown transistor 202 includes a gate 206 over a fin 208. The gate 206 is spaced apart from the gate 110 by a separation, $S_4$, where $S_4$ is equal to a width of the gate endcap structure 204. In the illustrative embodiment, the gate endcap structure 204 includes a dielectric 210 between the fin 124 and the fin 208 and a dielectric 212 on the dielectric 210, with no fuse in between the dielectrics 210 and 212. In an embodiment, $S_4$, is between 15 nm and 25 nm. In the illustrative embodiment, $S_4$, is substantially equal to $W_D$. In other embodiments, $S_4$, is greater than or less than $W_D$.

In embodiments, gate 206 includes a same material as the material of gate 110 or gate 108. In embodiments, dielectric 210 includes a material of the dielectric 130 and dielectric 212 includes a material of the dielectric 118. In an embodiment, the fin 208 includes a material that is the same is the same as the material of fin 122.

In the examples illustrated in FIGS. 1A and 2A the gate 108, 110, 206 are over a single fin. In other examples, the transistors 102, 104, 106 and 202 include a plurality of fins, where the plurality includes 2-10 fins.

Figure 2B:
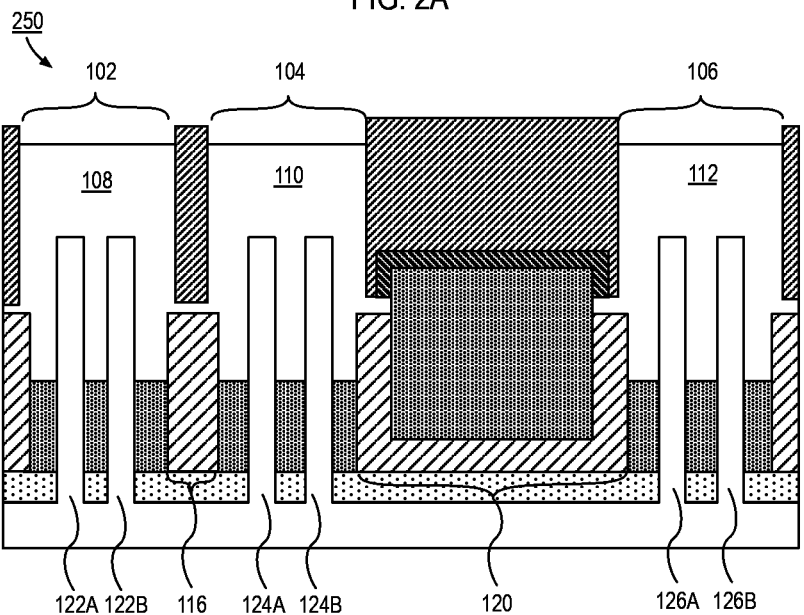
FIG. 2B is a cross-sectional illustration of a device structure where each transistor includes two fins.

FIG. 2B is a cross-sectional illustration of a device structure 250 where each transistor includes two fins. The device structure 250 has one or more properties of device structure 100. In the illustrative embodiment, device structure 250 includes the transistor 102, 104 and 106 where transistors 102, 104 and 106 include gates 108, 110 and 112, respectively. As shown gate 108 is over fins 122A and 122B, gate 110 is over fins 124A and 124B and gate 112 is over fins 126A and 126B. The gate endcap structure 116 is between fins 122B and 124A and gate endcap structure 120 is between fins 124B and 126A. In the illustrative embodiment, there is no gate endcap structure present between fins 122A and 122B, between fins 124A and 124B and between fins 126A and 126B. In embodiments, the spacing between fins 122A and 122B, between fins 124A and 124B and between fins 126A and 126B is between 5 nm and 25 nm.

Figure 3:
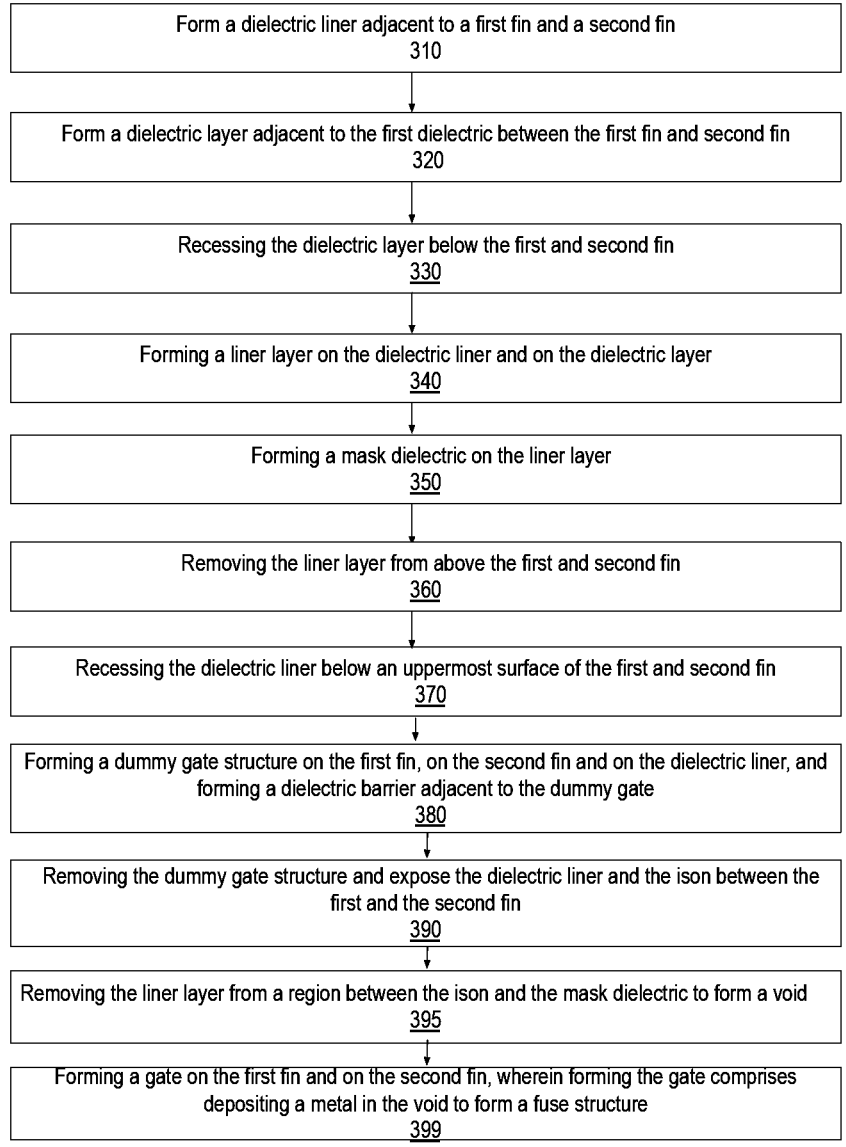
FIG. 3 is a method to fabricate a device structure such as device structure described in association with FIG. 1B.

FIG. 3 is a method 300 to fabricate a device structure such as device structure 100 described in association with FIG. 1B, in accordance with an embodiment of the present disclosure. The method 300 begins at operation 310 with the formation of a dielectric liner adjacent a first and a second fin. The method 300 continues at operation 320 with deposition of a dielectric layer on the dielectric liner between the first fin and second fin. The method 300 continues at operation 330 with recessing the dielectric layer below the first and the second fin structure. The method 300 continues at operation 340 with the formation of a liner layer on the dielectric liner and on the dielectric layer. The method 300 continues at operation 350 with the formation of a mask dielectric on the liner layer. The method 300 continues at operation 360 with the removal of the liner layer from above the first and second fin. The method 300 continues at operation 370 with the recessing the dielectric liner below an uppermost surface of the first and second fin. The method 300 continues at operation 380 with the formation of a dummy gate structure on the first fin, on the second fin and on the dielectric liner and a dielectric barrier adjacent the dummy gate structure. The method 300 continues at operation 390 with the removal of the dummy gate structure and expose the dielectric liner and the dielectric layer between the first and the second fin. The method 300 continues at operation 395 with the removal of the liner layer from a region between the dielectric layer and the mask dielectric to form a void. The method concludes at operation 399 formation of a gate on the first fin and on the second fin, wherein forming the gate comprises depositing a metal in the void to form a fuse structure.

Figure 4A:
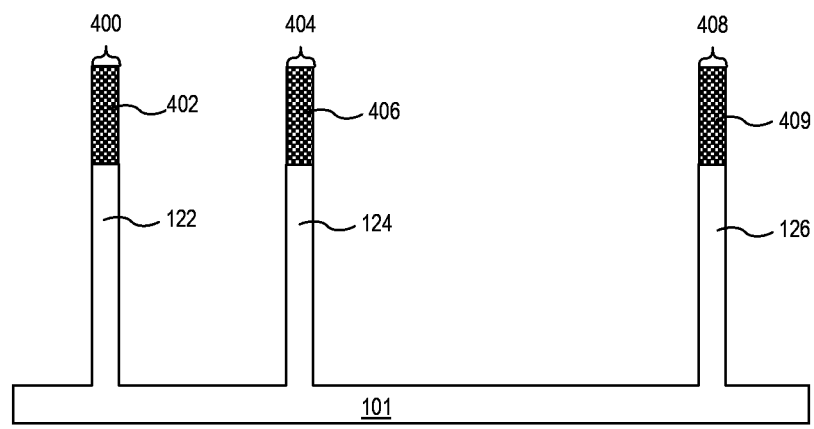
FIG. 4A is a cross-sectional illustration of plurality of fin structures patterned over a substrate in accordance with an embodiment of the present disclosure.

FIG. 4A is a cross-sectional illustration of plurality of fin structures patterned over substrate 101, in accordance with an embodiment of the present disclosure. As shown, fin structure 400 includes a sacrificial pillar 402 over a fin 122, fin structure 404 includes a sacrificial pillar 406 over fin 124 and fin structure 408 includes a sacrificial pillar 409 over fin 126.

In an embodiment, a blanket layer of amorphous silicon is deposited over a substrate 101. The amorphous silicon and portions of the substrate 101 are patterned and etched to form fin structures 400, 404 and 408.

In an embodiment, substrate 101 includes a material such as single crystal silicon, polycrystalline silicon and silicon on insulator (SOI), as well as substrates formed of other semiconductor materials such as group III-V materials. In some embodiments, the substrate 101 may also include semiconductor dopants depending on a desired MOS characteristic.

Figure 4B:
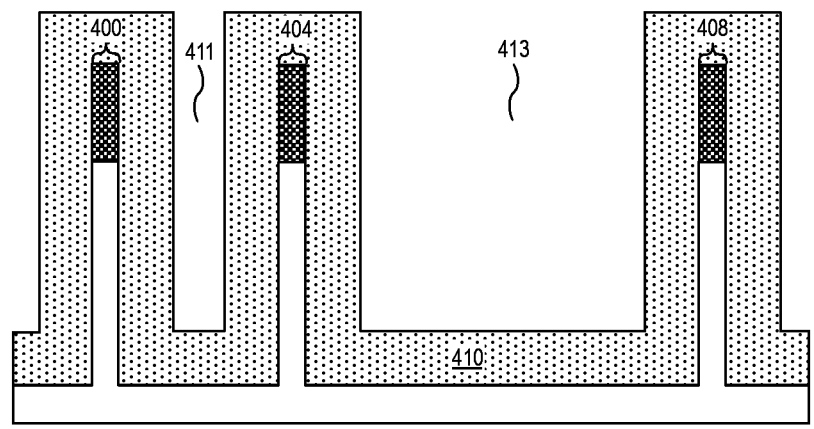
FIG. 4B is a cross-sectional illustration of the structure in FIG. 4A following the formation of a first dielectric.

FIG. 4B is a cross-sectional illustration of the structure in FIG. 4A following the formation of a dielectric 410. In an embodiment, the dielectric 410 includes a material that is the same or substantially the same as the material of the dielectric 146. In an embodiment, the dielectric 410 is blanket deposited on the fin structures 400, 404 and 408 and on the substrate 101. The dielectric 410 forms a substantially conformal layer around the fin structures 400, 404 and 408. The deposition process may include a PECVD (plasma enhanced chemical vapor deposition), physical vapor deposition (PVD), chemical vapor deposition (CVD) process. In an embodiment, the dielectric includes silicon and nitrogen and/or carbon.

In an embodiment, where the fin structures 400 and 404 are proximate to each other a gap 411 is formed between the dielectric 410 formed on each of the fin structures 400 and 404. In the illustrative embodiment, a larger gap 413 is formed between fin structures 404 and 408.

Figure 4C:
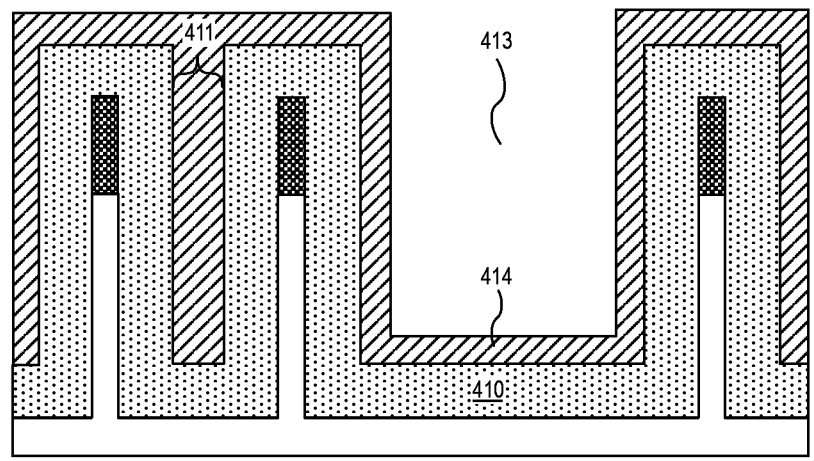
FIG. 4C illustrates the structure of FIG. 4B following the formation of a second dielectric on the first dielectric.

FIG. 4C illustrates the structure of FIG. 4B following the formation of a dielectric 414 on the dielectric 410. In an embodiment, the dielectric includes a material that is the same or substantially the same as the material of the dielectric 130. In an exemplary embodiment the dielectric 414 includes silicon and one or more of oxygen, nitrogen or carbon.

In an embodiment, the dielectric 414 is blanket deposited on the dielectric 410. The deposition process may include a PECVD (plasma enhanced chemical vapor deposition), physical vapor deposition (PVD), chemical vapor deposition (CVD) process. In an embodiment, the dielectric 414 includes silicon and nitrogen and/or carbon. In the illustrative embodiment, the dielectric 414 fills the gap 411 and forms a liner on the dielectric 410 in the gap 413.

Figure 4D:
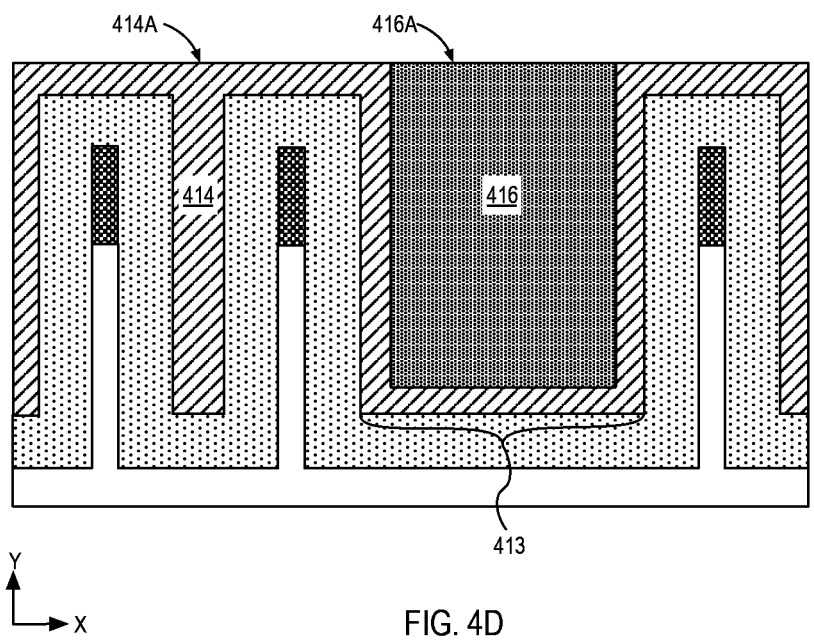
FIG. 4D illustrates the structure of FIG. 4C following the formation of a third dielectric on the second dielectric.

FIG. 4D illustrates the structure of FIG. 4C following the formation of a dielectric 416 on the dielectric 414. In an embodiment, dielectric 416 is blanket deposited into the gap 413. The deposition process may include a PECVD (plasma enhanced chemical vapor deposition), physical vapor deposition (PVD), chemical vapor deposition (CVD) process. In an embodiment, dielectric 416 includes silicon and at least one of oxygen, nitrogen and carbon having a flowable composition. The dielectric 416 is suitable for filling small and large openings. The dielectric 416 is annealed at temperature above 400 after the deposition process.

In an embodiment, the dielectric 416 is planarized. In an embodiment, a chemical mechanical polish (CMP) process is utilized to planarize the dielectric 416 which forms an uppermost surface 416A that is substantially co-planar, with an uppermost surface 414A of the dielectric 414.

Figure 4E:
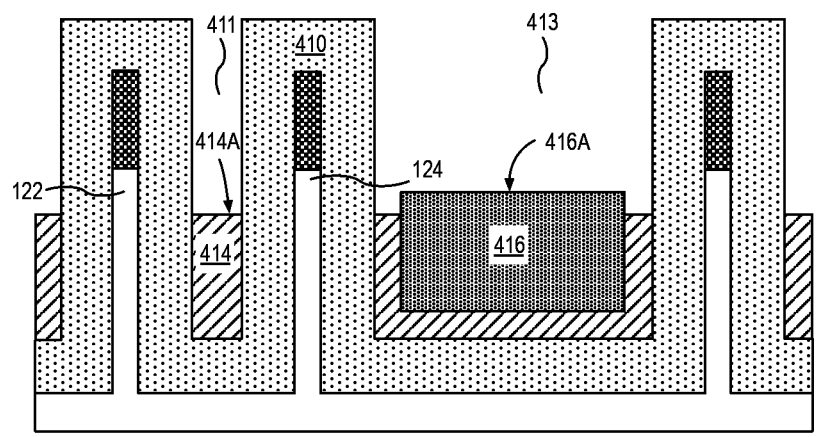
FIG. 4E illustrates the structure of FIG. 4D following the process to recess the first and second dielectric and selectively to third dielectric.

FIG. 4E illustrates the structure of FIG. 4D following the process to recess the dielectric 414 and 416 selectively to dielectric 410. In an embodiment, a combination of wet chemical etch and plasma etch is utilized to recess the dielectric 414 and 416. In an embodiment, a wet chemical process is utilized to recess dielectric 414 selective to dielectric 416. In an embodiment, the dielectric 414 is recessed below a level of an uppermost surface of fin 122 or 124. In an embodiment, the dielectric 416 is recessed below a level of an uppermost surface of the fin 122 or 124 but above the level of the dielectric 414. In other embodiments, uppermost dielectric surface 414A and dielectric surface 416A are at a same level. Recessing the dielectric 414 and 416 re-opens the gaps 411 and 413.

Figure 4F:
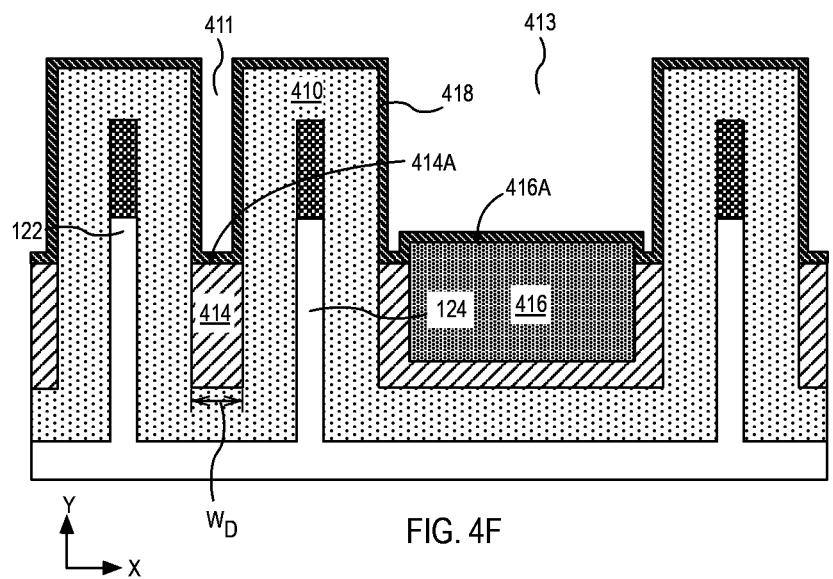
FIG. 4F illustrates the structure of FIG. 4E following the formation of a liner layer.

FIG. 4F illustrates the structure of FIG. 4E following the formation of a liner layer 418. In an embodiment, the liner layer 418 includes a material that is the same or substantially the same as the material of the liner layer 142 described above. In an embodiment, liner layer 418 is blanket deposited on upper and sidewall surfaces of the dielectric 410, on to uppermost dielectric surface 414A and on the uppermost dielectric surface 416A. The deposition process may include a PECVD (plasma enhanced chemical vapor deposition), physical vapor deposition (PVD), chemical vapor deposition (CVD) process. In an embodiment, the liner layer 418 is deposited to a thickness that will determine a thickness of a fuse that will be fabricated in a downstream operation. The liner layer 418 is deposited to a thickness to enable a desired thickness of the gate dielectric layer and a gate material utilized to form the fuse. For example, a portion of the liner layer 418 that is deposited above the dielectric 414 between fins 122 and 124 will determine a maximum thickness of the fuse formed between fins 122 and 124. In an embodiment, the liner layer 418 is deposited to a thickness of at least 3 nm.

In some embodiments, the as-deposited thickness of the liner layer 418 is dependent on a lateral width, $W_D$, of the dielectric 414 between fins 122 and 124. The process utilized to remove the liner layer 418 will depend on the thickness of the of the liner layer 418 and a lateral extent over a dielectric such dielectric 414 or dielectric 416.

As shown, the liner layer 418 reduces a lateral width (along the X-direction) of the gap 411 and the gap 413. In an embodiment, lateral width the gap 411 and the gap 413 determines a width of a dielectric that will be deposited in the following operation.

Figure 4G:
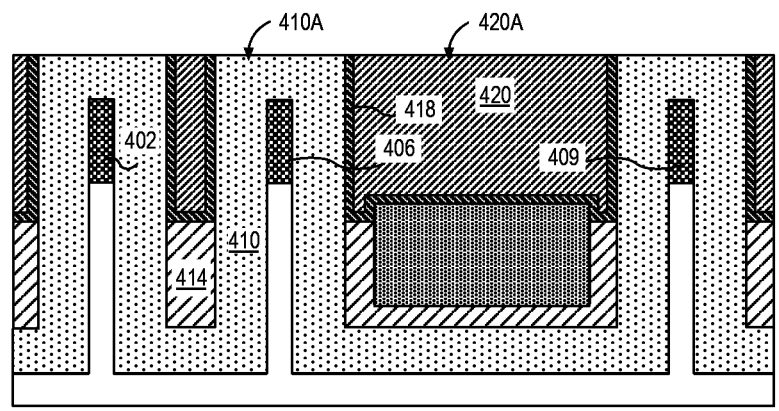
FIG. 4G illustrates the structure of FIG. 4H following the formation of a fourth dielectric on the liner layer and following a planarization process.

FIG. 4G illustrates the structure of FIG. 4H following the formation of a dielectric 420 on the liner layer 418 and following a planarization process. In an embodiment, the dielectric 420 includes a material that is the same or substantially the same as the material of the dielectric 114 or 118 described above. In an embodiment, dielectric 420 is blanket deposited on to the liner layer 418. The deposition process may include a PECVD (plasma enhanced chemical vapor deposition), physical vapor deposition (PVD), chemical vapor deposition (CVD) process or an atomic layer deposition (ALD) process. The dielectric 420 includes a material that is the same or substantially the same as the material of the dielectric 114 or 118. In an embodiment, the dielectric 420 is planarized. In an embodiment, a chemical mechanical polish (CMP) process is utilized to planarize the dielectric 420 which forms an uppermost surface 420A that is substantially co-planar with an uppermost surface 410A of the dielectric 410. Upper portions of the liner layer 418 above the dielectric 410 are also removed during the CMP process. The planarization process does not expose the sacrificial pillars 402, 406 or 409.

Figure 5A:
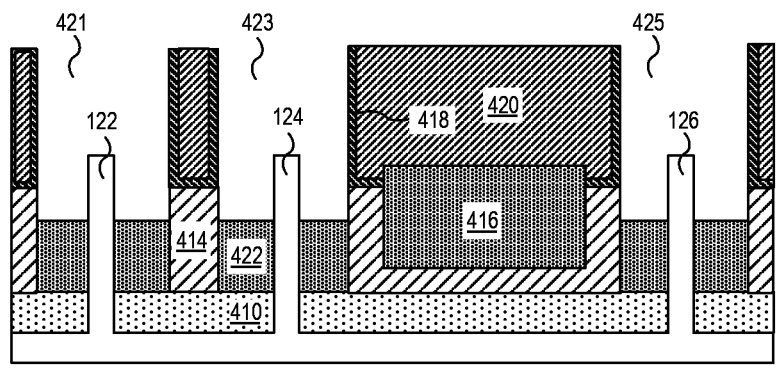
FIG. 5A illustrates the structure of FIG. 4G following a process to recess the first dielectric.

FIG. 5A illustrates the structure of FIG. 4G following a process to recess the dielectric 410. In an embodiment, the dielectric 410 is recessed by a wet chemical etch process selectively to the dielectric 420, the liner layer 418, fins 122, 124 and 126. In an embodiment, the dielectric 410 is recessed by utilization of a chemical fluid selective to liner layer 418. In the illustrative embodiment, the dielectric 410 is recessed to a level of a lowermost surface of the dielectric 414 to prevent undercutting of the dielectric 410 below dielectric 414. The dielectric 420 formed above the dielectric 414 between fins 122 and 124 constitutes a self-aligned gate endcap structure 426A and dielectric 420 formed above the dielectric 414 between fins 124 and 126 constitutes a self-aligned gate endcap structure 426B.

As shown, sacrificial pillars 402, 406 or 409 are also removed. In an embodiment, the dielectric 410 is recessed to expose uppermost surfaces of sacrificial pillars 402, 406 or 409. The sacrificial pillars 402, 406 or 409 may be etched by a plasma etch or a wet chemical process. The process utilized to etch the sacrificial pillars 402, 406 or 409 does not affect the fins 122, 124 or 126. In an embodiment, after removal of the sacrificial pillars 402, 406 or 409 the dielectric 410 is recessed. The process of removal of the sacrificial pillars 402, 406 or 409 and recessing dielectric 410 creates opening 421, 423 and 425 as shown.

In an embodiment, a dielectric 422 is blanket deposited after the processes utilized to recess dielectric 410 and etch sacrificial pillars 402, 406 or 409 into the openings 421, 423 and 425. In an embodiment, the dielectric 422 includes a material that is the same or substantially the same as the material of the dielectric 416. The dielectric 422 may be blanket deposited on the exposed fins 122, 124 and 126, on exposed portions of the liner layer 418, and on the dielectric 410. The deposition process may include a PECVD (plasma enhanced chemical vapor deposition), physical vapor deposition (PVD), chemical vapor deposition (CVD) process. In an embodiment, dielectric 422 includes silicon and at least one of oxygen, nitrogen and carbon having a flowable composition. The dielectric 422 is suitable for filling small and large openings such as regions between dielectric 414 and the fins 122, 124 and 126. The dielectric 422 may be annealed at temperature above 400 after the deposition process. The anneal process enables the dielectric 422 to have a greater resistance to a wet process that will be utilized to remove liner layer 418 in a downstream operation.

In an embodiment, the dielectric 422 is planarized after deposition by a CMP process. The dielectric 422 is then recessed below uppermost surfaces of the fins 122, 124 and 126 selectively to the liner layer 418, dielectric 420 and fins 122, 124 and 126. Recessing of the dielectric 422 defines a fin height for non-planar transistors that are to be formed.

Figure 5B:
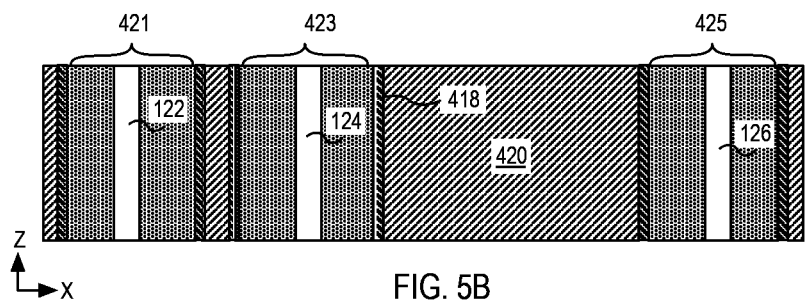
FIG. 5B is a plan view cross section of the illustration in FIG. 5A.

FIG. 5B is a plan view cross section of the illustration in FIG. 5A. In the illustrative embodiment, the openings 421, 423, and 425 exposes the fins 122, 124 and 126. A lateral extent (along Z-direction) of the dielectric 420 is illustrated in the plan view illustration.

FIG. 6A illustrates the structure of FIG. 5B following the formation of dummy gate structure portions in the openings 421, 423 and 425. In an embodiment, a dummy gate dielectric layer is blanket deposited into the openings 421, 423 and 425, the liner layer 418 and on the dielectric 420. A dummy gate material is then deposited onto the dummy gate dielectric layer. In an embodiment, the dummy gate material and the dummy gate dielectric layer are patterned to form a dummy gate structure 427 shown. The dummy gate structure 427 defines the lateral extent of gates that will be formed in a downstream operation.

After formation of the dummy gate, a dielectric spacer 430 may be formed adjacent to the dummy gate 427. In an embodiment, a dielectric spacer layer is blanket deposited in the openings 421, 423, and 425 and then patterned. In an embodiment, after formation of the dielectric spacer 430, epitaxially doped source or drain structures 431, 433 and 435 are formed on the fins 122, 124 and 126, respectively.

FIG. 6B illustrates the structure of FIG. 6A following the formation of a dielectric 437 in the openings 421, 423 and 425. The dielectric 437 may be blanket deposited in the openings 421, 423 and 425, on the epitaxially doped source or drain structures 431, 433 and 435 adjacent to the dielectric spacer 430. In the illustrative embodiment, the dielectric 437 is also deposited on dielectric 420, liner layer 418 and on (dielectric 422 not shown in Figure). The deposition process may include a PECVD (plasma enhanced chemical vapor deposition), physical vapor deposition (PVD), chemical vapor deposition (CVD) process. In an embodiment, dielectric 437 includes silicon and at least one of oxygen, nitrogen and carbon. In an embodiment, the dielectric 437 is planarized after deposition.

FIG. 6C illustrates the structure of FIG. 6B following the removal of the dummy gate structure 427. In an embodiment, the dummy gate structure 427 is removed by a combination of plasma etch and wet chemical etch process. After removal of the dummy gate structure 427 the dummy gate dielectric layer under the dummy gate structure 427 is also removed. The removal of the dummy gate dielectric layer under the dummy gate structure 427 is performed selectively to the fins 122, 124 and 126, the dielectric 420, the dielectric 437 and the liner layer 418.

Figure 7A:
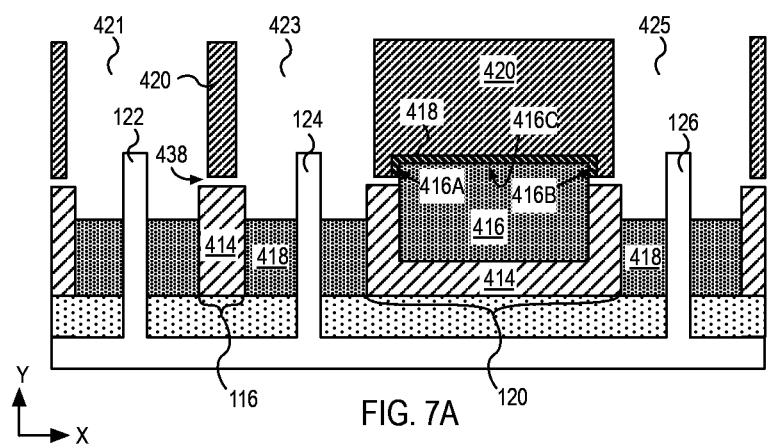
FIG. 7A illustrates a cross sectional view along a line A-A' of the structure of FIG. 6B following a process to remove the liner layer.

FIG. 7A illustrates a cross sectional view along a line A-A' of the structure of FIG. 6C following a process to remove the liner layer 418. In an embodiment, the liner layer 418 is removed by a wet chemical process prior to formation of gates. As shown, the liner layer 418 is removed in region between the dielectric 420 and dielectric 414 between the gaps 421 and 423. In an embodiment, the wet chemical process includes dissolving the structure of FIG. 6B in an acid. In the illustrative embodiment, the capillary effects of the wet etch has a limited penetration between the dielectric 420 and dielectric 414. In an embodiment, the wet etch removes the liner layer 418 between the dielectric 420 and dielectric 414 from the gaps 421 and 423. Removal of the liner layer 418 between the dielectric 420 and dielectric 414 and between fins 122 and 124 forms the gate endcap structure 116 with a gap 438. The gap 438 connects the gap 421 with gap 423. The liner layer on sidewalls of the dielectric 420 is also removed.

In the region between the fins 124 and 126, the liner layer 418 is removed adjacent to portions of the dielectric 416. In the illustrative embodiment, the liner layer 418 is removed from a region between the dielectric 420 and dielectric 414 that is directly adjacent to the dielectric 416. As shown, the liner layer 418 is not removed from sidewalls 416A and 416B or from top surface 416C.

The dielectric 420 is anchored to the dielectric 437 (not shown in the cross-sectional illustration).

Figure 7B:
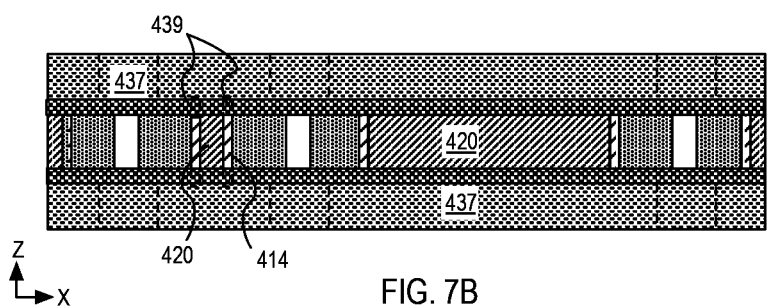
FIG. 7B is a plan-view illustration of the structure of FIG. 7A

FIG. 7B is a plan-view illustration of the structure of FIG. 7A. In the illustrative embodiment, after removal of liner layer from sidewalls of the dielectric 420 uppermost surfaces of the dielectric 414 are exposed. In the illustrative embodiment, portions of the liner layer 418, along the Z direction, may be removed from under the dielectric 437 (inside dashed boxes 439).

Figure 8A:
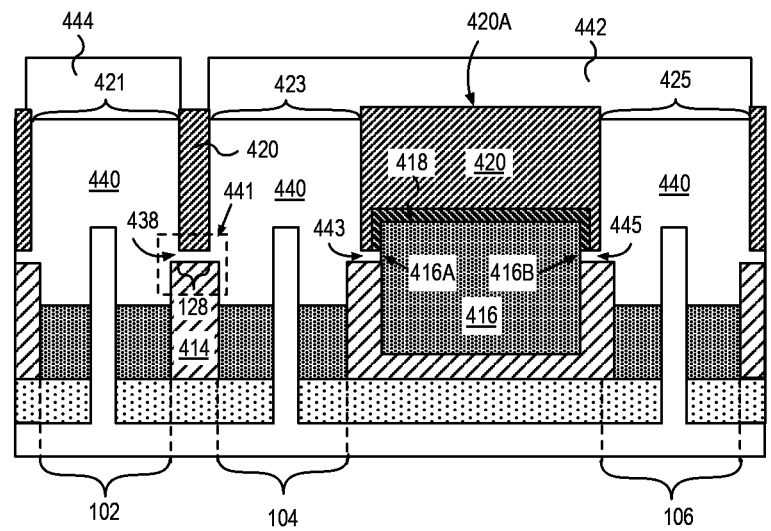
FIG. 8A illustrates the structure of FIG. 7A following the formation of a fuse and a plurality of transistor gates.
Figure 8B:
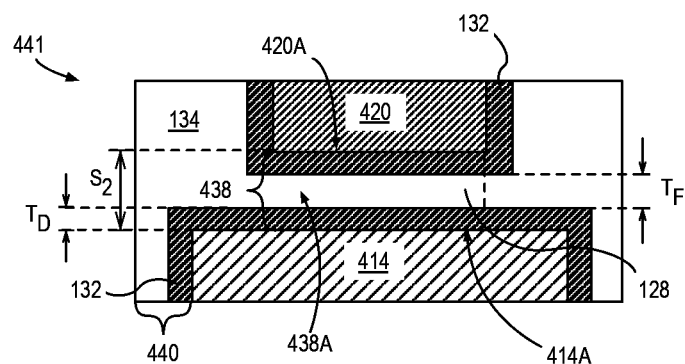
FIG. 8B is an enhanced cross-sectional illustration of a fuse formed between two dielectric layers.

FIG. 8A illustrates the structure of FIG. 7A following the formation of a fuse 128 and a plurality of transistor gates. In an embodiment, a gate material 440 is deposited in the openings 421, 423 and 425. In an embodiment, depositing the gate material 440 includes depositing a gate dielectric layer in the opening 421, 423 and 425 and a gate electrode material on the gate dielectric layer. FIG. 8B is an enhanced cross-sectional illustration of the box 441 in FIG. 8A. As shown, gate dielectric layer 132 is deposited to a thickness, $T_D$, that is less than a thickness of the gap 438, $S_2$. The gate dielectric layer 132 and gate electrode material 134 may be deposited by an atomic layer deposition process to ensure that gap 438 is filled. The gate dielectric layer 132 is deposited in the gap 438 and adheres to a lowermost surface 420A of the dielectric 420 and to an uppermost surface 414A of the dielectric 414. As shown, the gate dielectric layer 132 is deposited between lowermost surface 420A and uppermost surface 414A in the gap 438. The gate dielectric layer 132 deposition process forms a gap portion 438A having a vertical thickness $T_F$. The gate electrode material 134 is deposited to fill the gap portion 438A and form the fuse 128. In some embodiments, the gate electrode material 134 includes one or more layers, where lowermost layer is thicker than $T_F$. In some such embodiments, any layer deposited after the lowermost layer in the one or more layers are not present in the gap 438.

Referring again to FIG. 8A, the gate dielectric layer is also deposited on the fins 122 and 124. In an embodiment, the gate electrode material is deposited on all exposed surfaces of the gate dielectric layer. The gate material 440 extends continuously between the gaps 421 and 423. The portion of the gate material within the gap 438 is the fuse 128 described in association with FIGS. 1B, and 1D and 1E.

The gate material 440 is also deposited in the gaps 443 and 445 adjacent to the dielectric sidewalls 416A and 416B. The gate electrode material is deposited on the gate dielectric layer formed adjacent to dielectric sidewalls 416A and 416B. However, because of the presence of liner layer 418 between the dielectric 416 and 420, between openings 423 and 425, there is no gate material 440 between the dielectric 416 and 420. In the illustrative embodiment, the gate material 440 in opening 425 is not connected to the gate material 440 in the opening 423. In some such embodiment, there is no fuse formed.

After deposition of the gate material 440, a planarization process is performed. The planarization process may include a CMP process. After planarization, the gate material 440 may be recessed below an uppermost surface 420A, as illustrated.

The process of recessing the gate provides electrical isolation between gate from one transistor and a gate from another transistor, in applications where there is no fuse connecting the two gates. Recessing completes formation of the transistor 102, 104 and 106 in the openings 421, 423 and 425 respectively.

An additional bridge conductor may be formed between two or more transistors. In the illustrative embodiment, a bridge conductor 442 is formed to connect the gate material 440 of transistor 104 with gate material 440 of transistor 106. In an embodiment, a layer of metal is deposited on the gate material 440 and on the dielectric 420. In an embodiment, the layer of metal is patterned to form a bridge conductor 442 that bridges the gate material 440 of transistor 104 with the gate material 440 of transistor 106. In some regions, the layer of metal may be patterned to form a stand-alone conductor 444 above the gate material 440 of transistor 102 as shown. Stand-alone conductor 444 is not connected to another transistor.

In some embodiments, a potential difference is applied between the standalone conductor 444 and the bridge conductor 442 to "blow" the fuse 128. In some such embodiments, the gate material 440 and particularly, the gate electrode material may be discontinuous at least within portions of the gap 438.

In some applications, a pair of transistors that are not separated by a wide gate endcap structure (greater than 50 nm for example) may need electrical isolation. The method 300 may be amended to form gate endcap structures with no fuse in applications where the spacing between gates is between 15 nm and 25 nm.

Figure 9A:
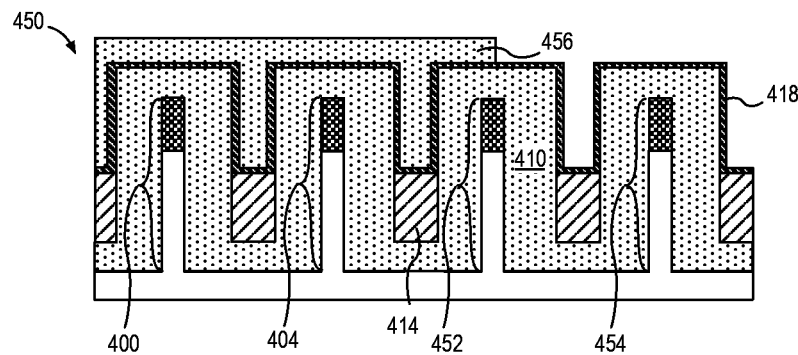
FIG. 9A is a cross-sectional illustration of a plurality of fin structures that have undergone processing operations described in association with FIGS. 4A to 4F.

FIG. 9A is a cross-sectional illustration of a plurality of fin structures post processing operations described in association with FIGS. 4A to 4F. In the illustrative embodiment, a device structure 450 includes fin structures 122, 124, 452 and 454. As shown, the fin structures 122, 124, 452 and 454 are spaced apart from each other by a substantially same distance. As shown, dielectric 410 encapsulates the fin structures 122, 124, 452 and 454 in a substantially uniform manner and liner layer 418 is blanket deposited on the dielectric 410.

In the illustrative embodiment, a masking layer 456 is formed, where the masking layer 456 extends over fin structures 122, 124, and partially over fin structure 452. In other embodiments, the masking layer can extend laterally beyond fin structure 452 in a direction towards fin structure 454 but not over the dielectric 414 between fin structures 452 and 454. The masking layer may be formed by a lithographic technique and may include a photosensitive material.

Figure 9B:
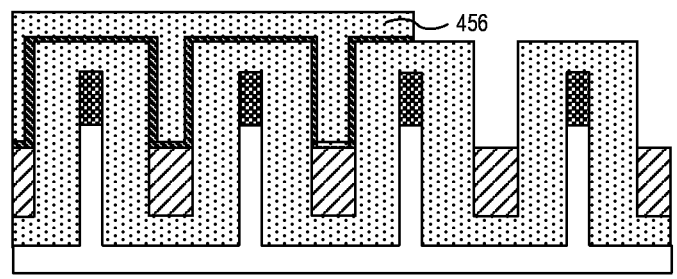
FIG. 9B illustrates the structure of FIG. 9A following the process to etch and remove a liner layer not covered by a masking layer.

FIG. 9B illustrates the structure of FIG. 9A following the process to etch and remove the liner layer 418 not covered by the masking layer 456. In an embodiment, a plasma etch process is carried out to etch the liner layer 418 selectively to the dielectric 410 and dielectric 414. As shown, the etch may include a plasma etch or a wet chemical etch or a combination thereof. As shown, the liner layer 418 is removed from above the dielectric 414 between the fin structures 452 and 454.

Figure 9C:
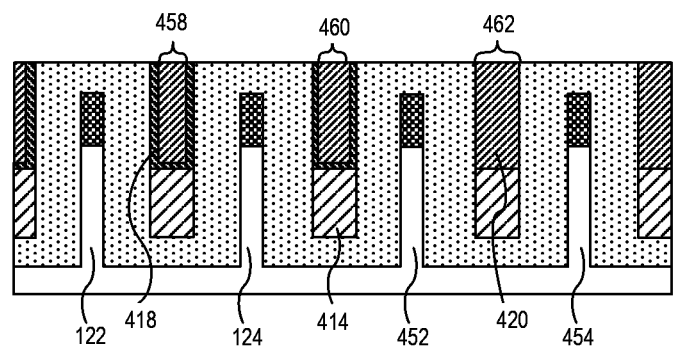
FIG. 9C illustrates the structure of FIG. 9B following the removal of the masking layer, deposition of an eight dielectric in openings between a first and a second fin and between a third and a fourth fin, followed by a planarization process.

FIG. 9C illustrates the structure of FIG. 9B following the removal of the masking layer 456, deposition of dielectric 420 in openings between fin structures 400 and 404, between fin structures 400 and 452 and between fin structures 452 and 454, followed by a planarization process.

In an embodiment, the removal of the masking material exposes the liner layer 418 in openings 458 and 460. In an embodiment, the process utilized to deposit dielectric 420 and the method utilized to planarize dielectric 420 is the same or substantially the same as methods described above. In the illustrative embodiment, the dielectric 420 is deposited on the liner layer 418 in openings 458 and 460. In some such embodiments, the dielectric 420 is deposited directly on the dielectric 414 in opening 462. An absence of liner layer 418 between dielectric 414 and 420 in the opening 462 will prevent a fuse from being formed between fin structures 452 and 454.

In an embodiment, the dielectric 420 is planarized. In an embodiment, the planarization process includes a CMP process. As shown, the CMP process removes the liner layer 418 from above the dielectric 410.

In an embodiment, operations described in association with FIGS. 5A-8 can be utilized to process the structure in FIG. 9C to obtain a first pair of transistors that are connected by a fuse and a second pair of transistors where there is no fuse connecting the second pair.

Figure 10:
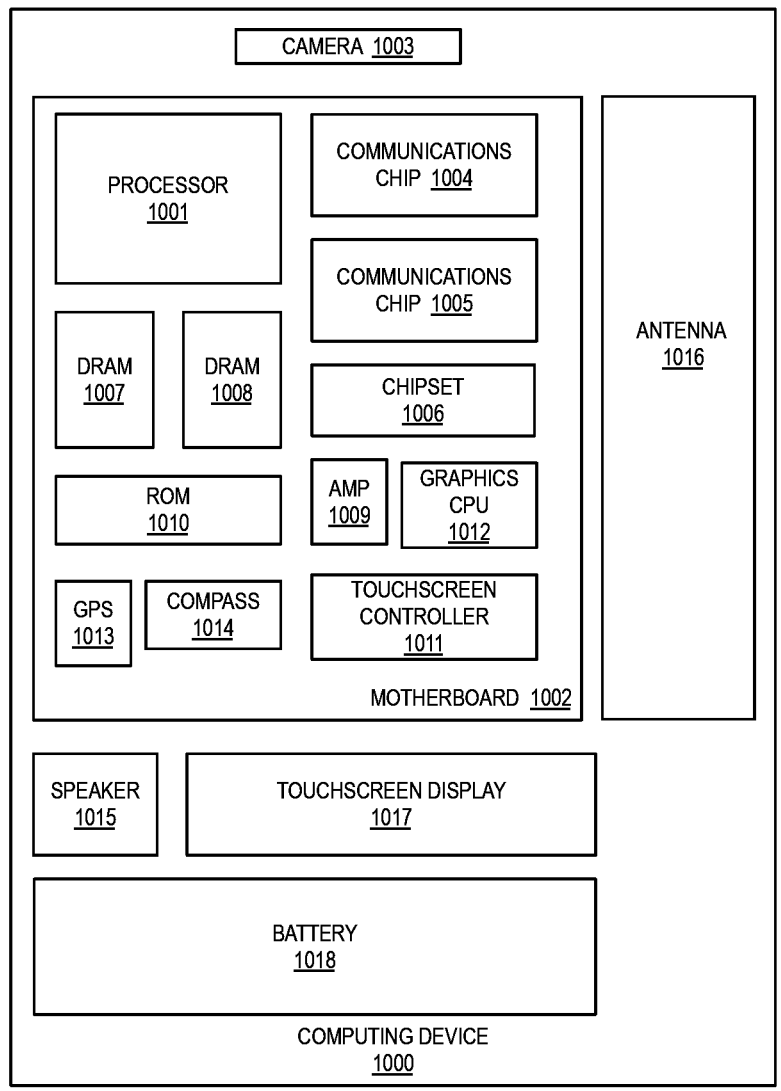
FIG. 10 illustrates a computing device in accordance with embodiments of the present disclosure.

FIG. 10 illustrates a computing device 1000 in accordance with embodiments of the present disclosure. As shown, computing device 1000 houses a motherboard 1002. Motherboard 1002 may include a number of components, including but not limited to a processor 1001 and at least one communications chip 1004 or 1005. Processor 1001 is physically and electrically coupled to the motherboard 1002. In some implementations, communications chip 1005 is also physically and electrically coupled to motherboard 1002. In further implementations, communications chip 1005 is part of processor 1001.

Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset 1006, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1005 enables wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1005 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1000 may include a plurality of communications chips 1004 and 1005. For instance, a first communications chip 1005 may be dedicated to shorter range wireless communications such as Wi-Fi and Bluetooth and a second communications chip 1004 may be dedicated to longer range wireless communications such as GPS, EDGE, GPRS, CDMA, WiMAX, LTE, Ev-DO, and others.

Processor 1001 of the computing device 1000 includes an integrated circuit die packaged within processor 1001. In some embodiments, the integrated circuit die of processor 1001 includes one or more interconnect structures, non-volatile memory devices, and transistors coupled with fuses such as device structure 100 described in FIGS. 1B. Referring again to FIG. 9, the term "processor" may refer to any device or portion of a device that processes electronic data from registers and/or memory to transform that electronic data into other electronic data that may be stored in registers and/or memory.

Communications chip 1005 also includes an integrated circuit die packaged within communication chip 1005. In another embodiment, the integrated circuit die of communications chips 1004, 1005 includes one or more interconnect structures, non-volatile memory devices, capacitors, and transistors coupled with fuses such as device structure 100 described in FIG. 1B Referring again to FIG. 10, depending on its applications, computing device 1000 may include other components that may or may not be physically and electrically coupled to motherboard 1002. These other components may include, but are not limited to, volatile memory (e.g., DRAM) 1007, 1008, non-volatile memory (e.g., ROM) 1010, a graphics CPU 1012, flash memory, global positioning system (GPS) device 1013, compass 1014, a chipset 1006, an antenna 1016, a power amplifier 1009, a touchscreen controller 1011, a touchscreen display 1017, a speaker 1015, a camera 1003, and a battery 1018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1000 and discussed above may contain a stand-alone integrated circuit memory die that includes one or more arrays of NVM devices.

In various implementations, the computing device 1000 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
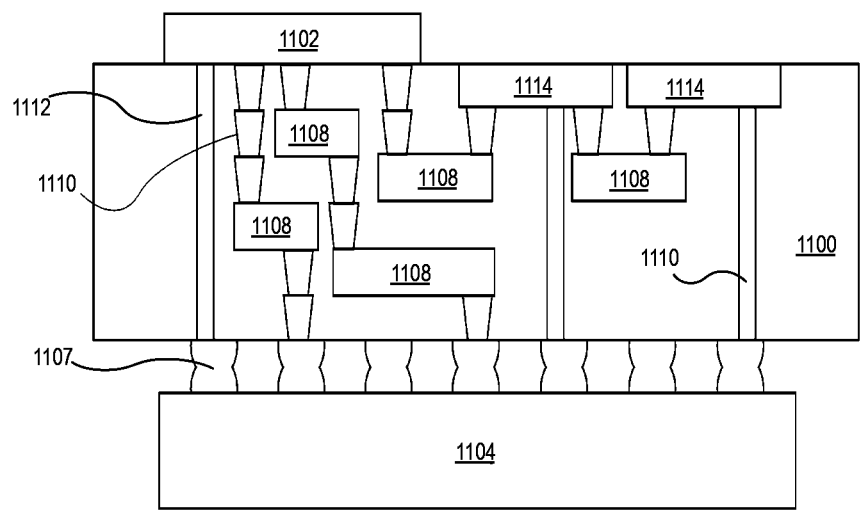
FIG. 11 illustrates an integrated circuit (IC) structure that includes one or more embodiments of the disclosure.

FIG. 11 illustrates an integrated circuit (IC) structure 1100 that includes one or more embodiments of the disclosure. The integrated circuit (IC) structure 1100 is an intervening substrate used to bridge a first substrate 1102 to a second substrate 1104. The first substrate 1102 may be, for instance, an integrated circuit die. The second substrate 1104 may be, for instance, a memory module, a computer mother, or another integrated circuit die. Generally, the purpose of an integrated circuit (IC) structure 1100 is to spread a connection to a wider pitch or to reroute a connection to a different connection. For example, an integrated circuit (IC) structure 1100 may couple an integrated circuit die to a ball grid array (BGA) 1107 that can subsequently be coupled to the second substrate 1104. In some embodiments, the first substrate 1102 and the second substrate 1104 are attached to opposing sides of the integrated circuit (IC) structure 1100. In other embodiments, the first substrate 1102 and the second substrate 1104 are attached to the same side of the integrated circuit (IC) structure 1100. And in further embodiments, three or more substrates are interconnected by way of the integrated circuit (IC) structure 1100.

The integrated circuit (IC) structure 1100 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1108 and vias 1110, including but not limited to through-silicon vias (TSVs) 1112. The integrated circuit (IC) structure 1100 may further include embedded devices 1114, including both passive and active devices. Such embedded devices 1114 include transistors, resistors, inductors, fuses coupled with transistors such as in device structure 100 described in FIGS. 1B-2B. Referring again to FIG. 11, the integrated circuit (IC) structure 1100 may further include embedded devices 1114 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1100.

Figure 12A:
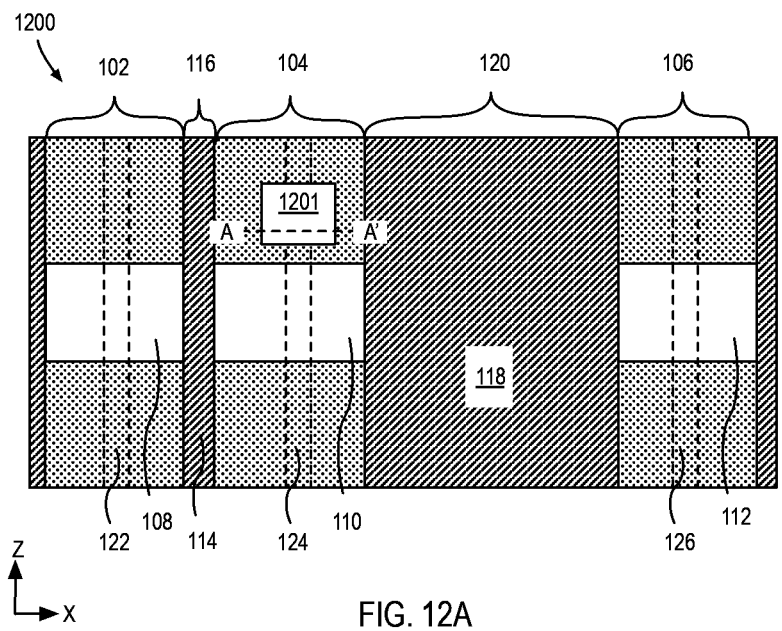
FIG. 12A is a plan-view illustration of a memory cell coupled with a transistor adjacent to a gate endcap, in accordance with an embodiment of the present disclosure.

FIG. 12A illustrates a cross-sectional view of a memory cell 1200 including a transistor 104 described in association with FIG. 1A and a memory structure 1201 coupled to a contact of the transistor 104. In the illustrative embodiment, the memory structure 1201 is coupled to a drain contact of the transistor 104. In other embodiments, the memory cell 1200 also includes memory structures such as memory structure 1201 individually coupled with transistors 102 and 106.

Figures 12B, 12C, 12D:
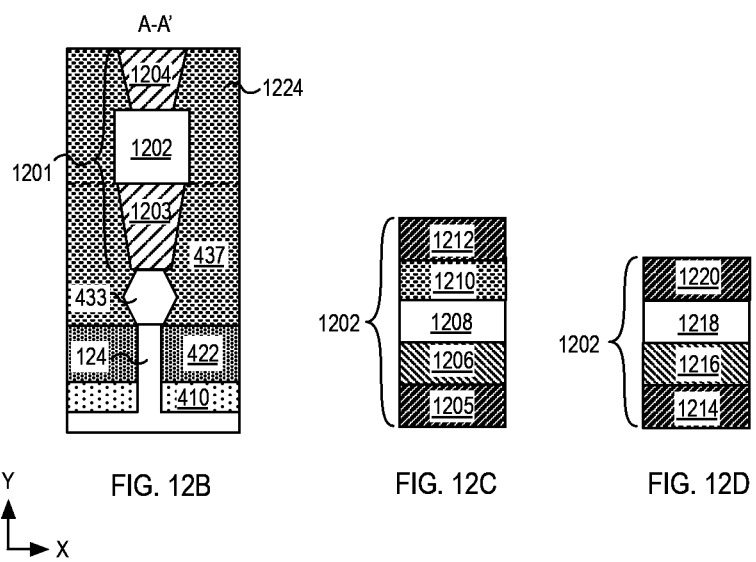
FIG. 12B is a cross-sectional illustration of the memory cell, in accordance with an embodiment of the present disclosure.
FIG. 12C is a cross-sectional illustration of a magnetic tunnel junction device, in accordance with an embodiment of the present disclosure.
FIG. 12D is a cross-sectional illustration of a resistive random-access memory device, in accordance with an embodiment of the present disclosure.

FIG. 12B is a cross-sectional illustration of the memory structure 1201 through a line A-A' in the structure of FIG. 12A, in accordance with an embodiment of the present disclosure. As shown, the memory structure 1201 includes a non-volatile memory element 1202 between a drain contact 1203 and an interconnect 1204. In other embodiments, there are one or more levels of interconnect between drain contact 1203 and volatile memory element 1202. In the illustrative embodiment, the drain contact 1203 is in contact with the epitaxial drain structure 433 above the fin 124.

Non-volatile memory element 1202 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, a non-planar transistor such as transistor 104, which can provide an additional current boost (through increase in drive current), can be advantageously coupled to non-volatile memory element 1202 such as an MTJ device to overcome critical switching current requirements.

FIG. 12C illustrates a cross-sectional view of an example non-volatile memory element 1202 that includes a magnetic tunnel junction (MTJ) material device. In the illustrated embodiment, the MTJ device includes a bottom electrode 1205, a fixed magnet 1206 above the bottom electrode 1205, a tunnel barrier 1208 on the fixed magnet 1206, a free magnet 1210 on the tunnel barrier 1208, and a top electrode 1212 on the free magnet 1210. In an embodiment, a dielectric spacer laterally surrounds (not shown) non-volatile memory element 1202.

In an embodiment, fixed magnet 1206 includes a material and has a thickness sufficient for maintaining a fixed magnetization. For example, fixed magnet 1206 may include an alloy such as CoFe and CoFeB. In an embodiment, fixed magnet 1206 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1206 is FeB, where the concentration of boron is between 10 and 40 atomic percent of the total composition of the FeB alloy. In an embodiment, the fixed magnet 1206 has a thickness that is between 1 nm and 2.5 nm.

In an embodiment, tunnel barrier 1208 is composed of a material suitable for allowing electron current having a majority spin to pass through tunnel barrier 1208, while impeding, at least to some extent, electron current having a minority spin from passing through tunnel barrier 1208. Thus, tunnel barrier 1208 (or spin filter layer) may also be referred to as a tunneling layer for electron current of a particular spin orientation. In an embodiment, tunnel barrier 1208 includes a material such as, but not limited to, magnesium oxide (MgO) or aluminum oxide ($Al_2O_{12}$). In an embodiment, tunnel barrier 1208 including MgO has a crystal orientation that is (001) and is lattice matched to free magnet 1210 below tunnel barrier 1208 and fixed magnet 1206 above tunnel barrier 1208. In an embodiment, tunnel barrier 1208 is MgO and has a thickness is between 1 nm to 2 nm.

In an embodiment, free magnet 1210 includes a magnetic material such as Co, Ni, Fe or alloys of these materials. In an embodiment, free magnet 1210 includes a magnetic material such as FeB, CoFe and CoFeB. In an embodiment, free magnet 1210 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1210 is FeB, where the concentration of boron is between 10 and 40 atomic percent of the total composition of the FeB alloy. In an embodiment, free magnet 1210 has a thickness that is between 1 nm and 2.0 nm.

In an embodiment, bottom electrode 1205 includes an amorphous conductive layer. In an embodiment, bottom electrode 1205 is a topographically smooth electrode. In an embodiment, bottom electrode 1205 includes a material such as W, Ta, TaN or TiN. In an embodiment, bottom electrode 1205 is composed of Ru layers interleaved with Ta layers. In an embodiment, bottom electrode 1205 has a thickness between 20 nm and 50 nm. In an embodiment, top electrode 1212 includes a material such as W, Ta, TaN or TiN. In an embodiment, top electrode 1212 has a thickness between 30 nm and 70 nm. In an embodiment, bottom electrode 1205 and top electrode 1212 are the same metal such as Ta or TiN. In an embodiment, the MTJ device has a combined total thickness of the individual layers is between 60 nm and 100 nm and a width is between 10 nm and 50 nm.

Referring again to FIG. 12B, in an embodiment, non-volatile memory element 1202 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100, that can provide an additional current boost (through increase in drive current), can be advantageously coupled to an RRAM device to provide reliable switching operation.

FIG. 12D illustrates a cross-sectional view of an example non-volatile memory element 1202 that includes a resistive random-access memory (RRAM) device. In the illustrated embodiment, the RRAM material stack includes a bottom electrode 1214, a switching layer 1216 over the bottom electrode 1214, an oxygen exchange layer 1218 over the switching layer 1216, and a top electrode 1220 on the oxygen exchange layer 1218.

In an embodiment, bottom electrode 1214 includes an amorphous conductive layer. In an embodiment, bottom electrode 1214 is a topographically smooth electrode. In an embodiment, bottom electrode 1214 includes a material such as W, Ta, TaN or TiN. In an embodiment, bottom electrode 1214 is composed of Ru layers interleaved with Ta layers. In an embodiment, bottom electrode 1214 has a thickness is between 20 nm and 50 nm. In an embodiment, top electrode 1220 includes a material such as W, Ta, TaN or TiN. In an embodiment, top electrode 1220 has a thickness is between 120 and 70 nm. In an embodiment, bottom electrode 1214 and top electrode 1220 are the same metal such as Ta or TiN.

Switching layer 1216 may be a metal oxide, for example, including oxygen and atoms of one or more metals, such as, but not limited to Hf, Zr, Ti, Ta or W. In the case of titanium or hafnium, or tantalum with an oxidation state +4, switching layer 1216 has a chemical composition, $MO_X$, where O is oxygen and X is or is substantially close to 2. In the case of tantalum with an oxidation state +5, switching layer 1216 has a chemical composition, $M_2O_X$, where O is oxygen and X is or is substantially close to 5. In an embodiment, switching layer 1216 has a thickness is between 1 nm and 5 nm.

Oxygen exchange layer 1218 acts as a source of oxygen vacancy or as a sink for $O^{2-}$. In an embodiment, oxygen exchange layer 1218 is composed of a metal such as but not limited to, hafnium, tantalum or titanium. In an embodiment, oxygen exchange layer 1218 has a thickness is between 5 nm and 20 nm. In an embodiment, the thickness of oxygen exchange layer 1218 is at least twice the thickness of switching layer 1216. In another embodiment, the thickness of oxygen exchange layer 1218 is at least twice the thickness of switching layer 1216. In an embodiment, the RRAM device has a combined total thickness of the individual layers is between 60 nm and 100 nm and width is between 10 nm and 50 nm.

Referring again to FIG. 12B, the drain contact 1203 is embedded in dielectric 437. A dielectric 1224 is on the dielectric 437. In the illustrative embodiment, the drain interconnect 1204 and the non-volatile memory element 1202 is embedded in the dielectric 1224.

In an embodiment, the drain contact 1203 and the drain interconnect 1204 includes a liner layer including ruthenium or tantalum and a fill metal such as copper or tungsten. In embodiments dielectric 1224 includes silicon and one or more of nitrogen, oxygen and carbon such as, silicon nitride, silicon dioxide, carbon doped silicon nitride, silicon oxynitride or silicon carbide.

Accordingly, one or more embodiments of the present disclosure relate generally to self-aligned gate endcap for FinFET architectures and methods of fabrication and may be used in embedded non-volatile memory and SOC applications In a first example, a device structure includes a first gate on a first fin, a second gate on a second fin, where the second gate is spaced apart from the first gate by a distance. A fuse spans the distance and is in contact with the first gate and the second gate. A first dielectric is between the first fin and the second fin, where the first dielectric is in contact with, and below, the fuse and a second dielectric is between the first gate and the second gate, where the second dielectric is on the fuse.

In second examples, for any of first examples, the first gate and the second gate include a gate dielectric and a gate metal, where the gate metal includes one or more of tantalum, titanium, nitrogen or tungsten In third examples, for any of the first through second examples, the fuse includes the gate metal, where the fuse includes a minimum thickness of 2 nm In fourth examples, for any of the first through third examples, the fuse is between the gate dielectric adjacent to the first insulator and the gate dielectric adjacent to the second insulator In fifth examples, for any of the first through fourth examples, the gate dielectric layer is adjacent to a sidewall of the first dielectric and a sidewall of the second dielectric In sixth examples, for any of the first through fifth examples, the first insulator includes silicon and one or more of oxygen, nitrogen and carbon, and where the second insulator includes oxygen and one or more of Hf, Zr, W or La.

In seventh examples, for any of the first through sixth examples, where the distance is between 15 nm and 25 nm In eighth examples, for any of the first through seventh examples, the distance is a first distance and the device structure further includes a third gate on a third fin, where the third gate is spaced apart from the second gate by a second distance. A third dielectric is between the first fin and the third fin and a fourth dielectric is on the third dielectric with no fuse therebetween.

In ninth examples, for any of the first through eighth examples, where the second distance is between 15 nm and 25 nm.

In tenth examples, for any of the first through ninth examples, the distance is a first distance and the device structure further includes a fourth gate on a fourth fin spaced apart from the second gate by a third distance, a fifth dielectric between the fourth fin and the second fin, a sixth dielectric within the fifth dielectric, a seventh dielectric above the fifth and the sixth dielectric and a liner layer in contact with and between the sixth dielectric and the seventh dielectric with no fuse therebetween.

In eleventh examples, for any of the first through tenth examples, the third distance is at least 50 nm.

In twelfth examples, for any of the first through eleventh examples, where the liner layer is at least 3 nm thick and where the liner layer includes silicon and at least one of oxygen, nitrogen or carbon.

In thirteenth examples, for any of the first through twelfth examples, the interface between the first dielectric and the second dielectric is nonplanar.

In a fourteenth example, for any of the first through thirteenth examples, a portion of the fuse is discontinuous between first gate and the second gate and wherein the portion that is discontinuous comprises a void.

In a fifteenth example, a device structure includes a first gate on a first fin, a second gate on a second fin, where the second gate is spaced apart from the first gate by a distance. A fuse spans the distance and is in contact with the first gate and the second gate. A first dielectric is between the first fin and the second fin, where the first dielectric is in contact with, and below, the fuse and a second dielectric is between the first gate and the second gate, where the second dielectric is on the fuse. The device structure further includes a third gate on a third fin, where the third gate is spaced apart from the second gate by a second distance, a third dielectric between the first fin and the third fin and a fourth dielectric on the third dielectric with no fuse therebetween.

In sixteenth examples, for any of the fifteenth through fifteenth examples, where the first gate and the second gate include a gate dielectric and a gate metal, where the gate metal includes one or more of tantalum, titanium, nitrogen or tungsten.

In seventeenth examples, for any of the fifteenth through sixteenth examples, where the fuse includes the gate metal, where the fuse includes a minimum thickness of 2 nm In eighteenth examples, for any of the fifteenth through seventeenth examples, where the fuse is between the gate dielectric adjacent to the first insulator and the gate dielectric adjacent to the second insulator In nineteenth examples, a method of fabricating a fuse includes forming a first fin and a second fin spaced by a distance and forming a dielectric liner adjacent the first and second fin. The method further includes depositing a dielectric layer on the dielectric liner between the first fin and second fin and recessing the dielectric layer below the first and the second fin structure. The method further includes forming a liner layer on the dielectric liner and on the dielectric layer and forming a mask dielectric on the liner layer. The method further includes removing the liner layer from above the first and second fin and recessing the dielectric liner below an uppermost surface of the first and second fin. The method further includes forming a dummy gate structure on the first fin, on the second fin and on the dielectric liner and forming a dielectric barrier adjacent the dummy gate structure and removing the dummy gate structure and expose the dielectric liner and the dielectric layer between the first and the second fin. The method further includes removing the liner layer from a region between the dielectric layer and the mask dielectric to form a void and forming a gate on the first fin and on the second fin, where forming the gate includes depositing a metal in the void to form a fuse structure.

In twentieth example, for any of the nineteenth examples, the distance is a first distance and the method further includes forming a third fin adjacent to the second fin, where the third fin is separated from the second fin by a second distance and forming the dielectric layer between the second fin and the third fin. The method further includes forming the liner layer on the dielectric layer and forming a mask dielectric on the liner layer. The method further includes partially removing the liner layer from a region between the dielectric layer and the mask dielectric and forming a gate on the third fin.

What is claimed is:
1. A device structure comprising:
a first gate on a first fin;
a second gate on a second fin, wherein the second gate is spaced apart from the first gate by a distance;
a fuse spanning the distance and in contact with the first gate and the second gate;
a first dielectric between the first fin and the second fin, wherein the first dielectric is in contact with, and below, the fuse; and
a second dielectric between the first gate and the second gate, wherein the second dielectric is on the fuse.
2. The device structure of claim 1, wherein the first gate and the second gate comprise a gate dielectric and a gate metal and wherein the fuse comprises the gate metal.
3. The device structure of claim 2, wherein the gate metal comprises one or more of tantalum, titanium, nitrogen or tungsten, and wherein the fuse comprises a minimum thickness of 2 nm.
4. The device structure of claim 2, wherein the fuse is between the gate dielectric adjacent to the first dielectric and the gate dielectric adjacent to the second dielectric.
5. The device structure of claim 2, wherein the gate dielectric is adjacent to a sidewall of the first dielectric and a sidewall of the second dielectric.
6. The device structure of claim 1, wherein the first dielectric comprises silicon and one or more of oxygen, nitrogen and carbon, and wherein the second dielectric comprises oxygen and one or more of Hf, Zr, La.
7. The device structure of claim 1, wherein the distance is between 15 nm and 25 nm.
8. The device structure of claim 1, wherein the distance is a first distance and the device structure further comprises:
a third gate on a third fin, wherein the third gate is spaced apart from the second gate by a second distance;
a third dielectric between the first fin and the third fin; and
a fourth dielectric on the third dielectric with no fuse therebetween.
9. The device structure of claim 8, wherein the second distance is between 15 nm and 25 nm.
10. The device structure of claim 1, wherein the distance is a first distance and the device structure further comprises:
a fourth gate on a fourth fin spaced apart from the second gate by a third distance;
a fifth dielectric between the fourth fin and the second fin;
a sixth dielectric within the fifth dielectric;
a seventh dielectric above the fifth dielectric and the sixth dielectric; and
a liner layer in contact with and between the sixth dielectric and the seventh dielectric with no fuse therebetween.
11. The device structure of claim 10, wherein the third distance is at least 50 nm.
12. The device structure of claim 1, wherein a portion of the fuse is discontinuous between the first gate and the second gate and wherein the portion that is discontinuous comprises a void.

13. The device structure of claim 10, wherein the liner layer is at least 3 nm thick and wherein the liner layer comprises silicon and at least one of oxygen, nitrogen or carbon.

14. The device structure of claim 1, wherein an interface between the first dielectric and the second dielectric is non-planar, and the fuse has a shape that is non-planar.

15. A device structure comprising:
- a first gate on a first fin;
- a second gate on a second fin, wherein the second gate is spaced apart from the first gate by a first distance;
- a fuse spanning the first distance and in contact with the first gate and the second gate;
- a first dielectric between the first fin and the second fin, wherein the first dielectric is in contact with, and below, the fuse;
- a second dielectric between the first gate and the second gate, wherein the second dielectric is on the fuse;
- a third gate on a third fin, wherein the third gate is spaced apart from the second gate by a second distance;
- a third dielectric between the first fin and the third fin; and
- a fourth dielectric on the third dielectric with no fuse therebetween.

16. The device structure of claim 15, wherein the first gate and the second gate comprise a gate dielectric and a gate metal, wherein the fuse comprises the gate metal.

17. The device structure of claim 16, wherein the gate metal comprises one or more of tantalum, titanium, nitrogen or tungsten, and wherein the fuse comprises a minimum thickness of 2 nm.

18. The device structure of claim 16, wherein the fuse is between the gate dielectric adjacent to the first dielectric and the gate dielectric adjacent to the second dielectric, and wherein the first distance is between 15 nm to 25 nm and the second distance is at least 50 nm.

* * * * *